United States Patent
Miyasaka et al.

(10) Patent No.: US 6,673,679 B1
(45) Date of Patent: Jan. 6, 2004

(54) SEMICONDUCTOR DEVICE WITH ALTERNATING CONDUCTIVITY TYPE LAYER AND METHOD OF MANUFACTURING THE SAME

(75) Inventors: Yasushi Miyasaka, Nagano (JP); Tatsuhiko Fujihira, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/481,242

(22) Filed: Jan. 11, 2000

(30) Foreign Application Priority Data

Jan. 11, 1999 (JP) .......................... 11-004176

(51) Int. Cl.[7] .......................................... H01L 21/336
(52) U.S. Cl. ...................................... 438/268; 438/138
(58) Field of Search ................................ 438/133, 138, 438/268, 369

(56) References Cited

U.S. PATENT DOCUMENTS

| | | | | |
|---|---|---|---|---|
| 4,754,310 A | | 6/1988 | Coe .......................... 357/13 |
| 5,141,889 A | * | 8/1992 | Terry et al. ................. 437/31 |
| 5,183,769 A | * | 2/1993 | Rutter et al. ............... 438/138 |
| 5,216,275 A | | 6/1993 | Chen ......................... 257/493 |
| 5,286,655 A | * | 2/1994 | Tsunoda ...................... 437/6 |
| 5,292,672 A | * | 3/1994 | Akiyama et al. ............. 437/31 |
| 5,438,215 A | | 8/1995 | Tihanyi ..................... 257/401 |
| 5,798,554 A | * | 8/1998 | Grimaldi et al. ............ 257/329 |
| 6,081,009 A | * | 6/2000 | Neilson ..................... 257/341 |
| 6,097,063 A | | 8/2000 | Fujihira ..................... 257/339 |
| 6,184,555 B1 | | 2/2001 | Tihanyi et al. .............. 257/342 |
| 6,307,246 B1 | * | 10/2001 | Nitta et al. ................. 257/493 |
| 6,475,864 B1 | * | 11/2002 | Sato et al. .................. 438/268 |
| 2001/0028083 A1 | * | 10/2001 | Onishi et al. ............... 257/328 |
| 2001/0046739 A1 | * | 11/2001 | Miyasaka et al. ........... 438/268 |

FOREIGN PATENT DOCUMENTS

| | | | |
|---|---|---|---|
| EP | 0053854 | 2/1986 | |
| JP | 401272158 A | * 10/1989 | ................. 438/133 |
| JP | 3-105975 A | 5/1991 | |

OTHER PUBLICATIONS

"Theory of Semiconductor Superjunction Devices"; Tatsuhiko Fujihara: Jpn. J. Appl. Phys. vol. 36 (1997), Part 1 No. 10, Oct. 1997; pp. 6254–6262.

* cited by examiner

*Primary Examiner*—John F. Niebling
*Assistant Examiner*—Angel Roman
(74) *Attorney, Agent, or Firm*—Rossi & Associates

(57) ABSTRACT

A semiconductor device has an alternating conductivity type layer that improves the tradeoff relation between the ON-resistance and the breakdown voltage and a method of manufacturing such a semiconductor device. The alternating conductivity type layer is formed of n-type drift regions and p-type partition regions alternately arranged with each other. At least the n-type drift regions or p-type partition regions are formed by ion implantation under an acceleration voltage changed continuously. The p-type partition regions or n-type drift regions are formed by epitaxial growth or by diffusing impurities from the surface of a substrate or a layer for the layer.

9 Claims, 14 Drawing Sheets

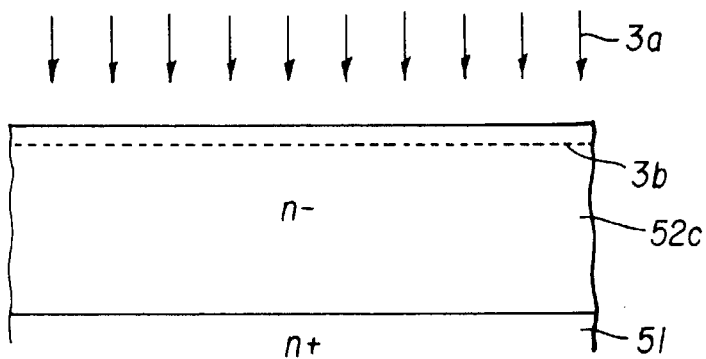
FIG. 9(a)
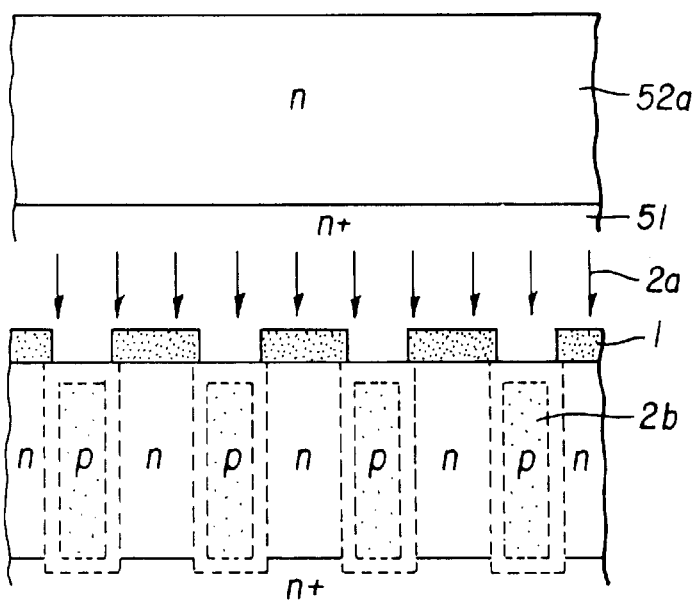
FIG. 9(b)
FIG. 9(c)
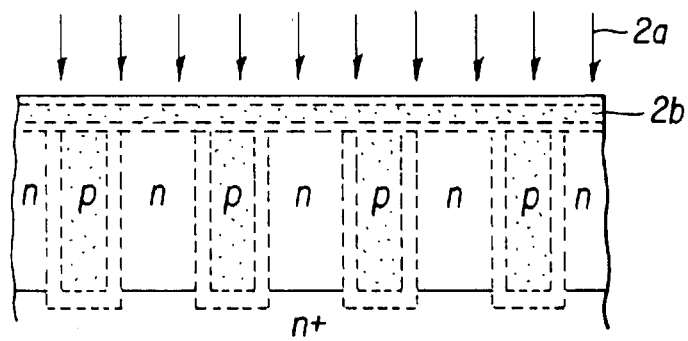
FIG. 9(d)
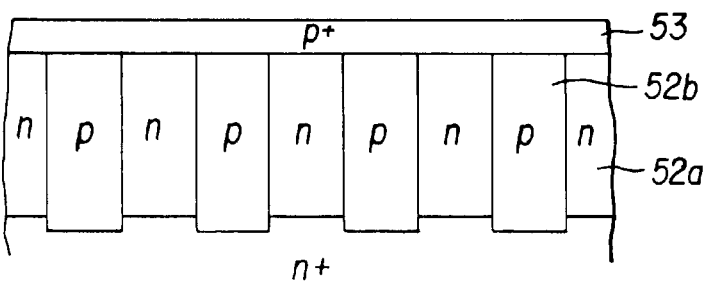
FIG. 9(e)

SEMICONDUCTOR DEVICE WITH ALTERNATING CONDUCTIVITY TYPE LAYER AND METHOD OF MANUFACTURING THE SAME

FIELD OF THE INVENTION

The present invention relates to a vertical semiconductor structure that facilitates realizing both a high breakdown voltage and a high current capacity in insulated gate field effect transistors (MOSFET's), insulated gate bipolar transistors (IGBT's), bipolar transistors, diodes and such semiconductor devices. The present invention relates also to a method of manufacturing the semiconductor device with such a vertical semiconductor structure.

BACKGROUND OF THE INVENTION

In vertical semiconductor devices, a current flows between electrodes disposed on both major surfaces opposing each other. For providing the vertical semiconductor devices with a higher breakdown voltage, it is necessary to form a thick highly resistive layer between the electrodes. However, the thick highly resistive layer inevitably causes a higher forward voltage for making a current flow between the electrodes and a higher ON-resistance. The higher forward voltage and the higher ON-resistance further cause loss increase. In short, there exits a tradeoff relation between the forward voltage and the breakdown voltage or between the ON resistance (current capacity) and the breakdown voltage.

EPO 053 854, U.S. Pat. No. 5,216,275, U.S. Pat. No. 5,438,215 and Japanese Unexamined Laid Open Patent Application H09 (1997)-266311 disclose semiconductor devices that include a drift layer including heavily doped n-type regions and p-type regions alternately laminated with each other to solve the foregoing problems. The alternately laminated n-type regions and p-type regions are depleted to bear the breakdown voltage in the OFF-state of the device.

FIG. 18 is a cross section of a part of the vertical MOSFET according to an embodiment of U.S. Pat. No. 5,216,275. The vertical MOSFET of FIG. 18 is different from the conventional vertical semiconductor devices in that the vertical MOSFET of FIG. 18 includes a drift layer 12, that is not single-layered but formed of n-type drift regions 12a and p-type partition regions 12b alternately laminated with each other. In the figure, there is a p-type well region 13, an n$^+$-type source region 14, a gate insulation film 15, a gate electrode 16, a source electrode 17, and a drain electrode 18. Although a drift current flows through n-type drift regions 12a, n-type drift regions 12a and p-type partition regions 12b will be collectively referred to hereinafter as drift layer 12.

Drift layer 12 is formed in the following way. First, a highly resistive n-type layer is grown epitaxially on an n$^+$-type drain layer 11. The n-type drift regions 12a are formed by etching the highly resistive n-type layer to form trenches down to n$^+$-type drain layer 11. Then, p-type partition regions 12b are formed by epitaxially growing p-type layers in the trenches.

Hereinafter, the semiconductor device, including an alternating conductivity type drift layer that provides a current path in the ON-state of the device and is depleted in the OFF-state of the device, will be referred to as a "semiconductor device with an alternating conductivity type layer".

The dimensions described in U.S. Pat. No. 5,216,275 are as follows. When the breakdown voltage is put in $V_B$, the thickness of the drift layer 12 is $0.024 V_B^{1.2}$ ($\mu$m). When n-type drift region 12a and p-type drift region 12b have the same width b and the same impurity concentration, the impurity concentration is $7.2 \times 10^{16} V_B^{-0.2}/b$ (cm$^{-3}$). If $V_B$ is 300 V and b is 5 $\mu$m, the drift layer 12 will be 23 $\mu$m in thickness and the impurity concentration $4.6 \times 10^{15}$ cm$^{-3}$. Since the impurity concentration for the single-layered drift layer is around $5 \times 10^{14}$ cm$^{-3}$, the on-resistance is reduced by drift layer 12. However, when using conventional epitaxial growth techniques, it is difficult to bury a good quality semiconductor layer in such a narrow and deep trench (with a large aspect ratio).

The tradeoff between the on-resistance and the breakdown voltage is also commonly encountered in lateral semiconductive devices. The foregoing EPO 053 854, U.S. Pat. No. 5,438,215 and Japanese Unexamined Laid Open Patent Application H09(1997)-266311 disclose lateral semiconductor devices with an alternating conductivity type layer and methods, common to the lateral semiconductor devices and vertical semiconductor devices, for forming the alternating conductivity type layer which employ the selective etching technique for digging trenches and the epitaxial growth technique for filling the trenches.

However, it is difficult to employ the selective etching technique for digging trenches and the epitaxial growth technique for filling the trenches in manufacturing the vertical semiconductor devices with an alternating conductivity type layer as explained with reference to U.S. Pat. No. 5,216,275. Japanese Unexamined Laid Open Patent Application H09 (1997)-266311 describes the nuclear transformation by a neutron beam and such radioactive beams. However, such nuclear transformation processes require large facilities and can not be used easily.

In view of the foregoing, it is an object of the invention to provide a semiconductor device with an alternating conductivity type layer that reduces the tradeoff relation between the forward voltage or the ON-resistance and the breakdown voltage. It is another object of the invention to provide a semiconductor device with an alternating conductivity type layer and with a high breakdown voltage that facilitates increasing the current capacity by reducing the forward voltage and the ON-resistance. It is still another object of the invention to provide a method for manufacturing such a semiconductor device with an alternating conductivity type layer easily and with excellent mass-productivity.

SUMMARY OF THE INVENTION

According to an aspect of the invention, there is provided a method of manufacturing a semiconductor device including: a layer with low electrical resistance having a first surface and a second surface, an electrode on the second surface of the layer with low electrical resistance, a pn-laminate having a first surface contacting the first surface of the layer with low electrical resistance and a second surface opposing the first surface thereof, at least one electrode on the second surface of the pn-laminate; and the pn-laminate formed of drift regions of a first conductivity type and partition regions of a second conductivity type opposite to the first conductivity type extending vertically between the first surface and the second surface of the pn-laminate in parallel to each other and arranged alternately with respect to each other horizontally, the pn-laminate providing a current path when the semiconductor device is ON and being depleted when the semiconductor device is OFF, the method including the steps of: implanting impurity ions; and treating the implanted impurity ions thermally thereby to form the drift regions or the partition regions.

Ion implantation and thermal treatment are well established techniques for forming a region of one conductivity type more easily than the other conventional techniques which need to dig a trench with a large aspect ratio and to fill the trench with an epitaxial layer. Advantageously, the acceleration voltage for implanting the impurity ions is changed stepwise.

By implanting impurity ions through multiple steps by changing the acceleration voltage stepwise, regions continuous in the depth direction thereof are formed.

Advantageously, the acceleration voltage for implanting the impurity ions is changed continuously to form regions which have a uniform width and are continuous in the depth direction thereof.

When the drift regions or the partition regions are formed by ion implantation, the partition regions or the drift regions are formed advantageously by epitaxial growth, by ion implantation or by thermally diffusing impurity ions from the surface.

When the drift regions or the partition regions are formed by diffusing impurity ions from the surface of an epitaxial layer or a diffusion layer, the partition regions or the drift regions are formed advantageously by implanting impurity ions from the surface of the epitaxial layer or the diffusion layer and by treating the implanted impurity ions thermally. Advantageously, the drift regions and the partition regions are formed by implanting respective impurity ions almost simultaneously and by treating the implanted impurity ions thermally.

According to another aspect of the invention, there is provided a method of manufacturing a semiconductor device including a layer with low electrical resistance having a first surface and a second surface, an electrode on the second surface of the layer with low electrical resistance, a pn-laminate having a first surface contacting the first surface of the layer with low electrical resistance and a second surface opposing the first surface thereof, at least one electrode on the second surface of the pn-laminate; and the pn-laminate formed of drift regions of a first conductivity type and partition regions of a second conductivity type opposite to the first conductivity type extending vertically between the first surface and the second surface of the pn-laminate in parallel to each other and arranged alternately with respect to each other horizontally, the pn-laminate providing a current path when the semiconductor device is ON and being depleted when the semiconductor device is OFF, the method including the steps of: forming a layer for forming the drift regions and the partition regions; introducing impurity ions into the surface portions of the layer for forming the drift regions and the partition regions, and diffusing the introduced impurity ions thermally thereby to form the drift regions, the partition regions and pn-junctions between the drift regions and the partition regions.

When the drift regions and the partition regions are arranged closely and alternately to each other by the quite well established ion introduction into the surface portions and by the quite well established thermal diffusion, pn-junctions are formed between the drift regions and the partition regions.

According to a further aspect of the invention, there is provided a semiconductor device including: a layer with low electrical resistance having a first surface and a second surface; an electrode on the second surface of the layer with low electrical resistance; a pn-laminate having a first surface contacting the first surface of the layer with low electrical resistance and a second surface opposing the first surface thereof; at least one electrode on the second surface of the pn-laminate; and the pn-laminate formed of drift regions of a first conductivity type and partition regions of a second conductivity type opposite to the first conductivity type extending vertically between the first surface and the second surface of the pn-laminate in parallel to each other and arranged alternately with respect to each other horizontally, wherein the pn-laminate provides a current path when the semiconductor device is ON and is depleted when the semiconductor device is OFF.

Advantageously, the junction depth y between the drift regions and the partition regions is large than the width x of the drift regions and the partition regions.

When the depth y of the junctions between the drift regions and the partition regions is large than the width x of the drift regions and the partition regions, depletion layer expand first for the full widths of the drift regions and the partition regions and, then, downward.

Advantageously, the junction depth $y_p$ of the partition regions is larger than the junction depth $y_n$ of the drift regions.

When the junction depth $y_p$ of the partition regions is smaller than the junction depth $y_n$ of the drift regions, the lower portions of the drift regions extended more deeply than the partition regions will not be depleted, causing the reduced breakdown voltage.

Advantageously, the junction depth $y_p$ of the partition regions is related with the junction depth $y_n$ of the drift regions by a relational expression $y_n < y_p \leq 1.2\, y_n$.

The junction depth $y_p$ of the partition regions much larger than the junction depth $y_n$ of the drift regions is useless.

Advantageously the semiconductor device further includes a lightly doped layer of the first conductivity type below the partition regions. Preferably, the thickness $t_n$ of the lightly doped layer of the first conductivity type is smaller that the junction depth $y_p$ of the partition regions.

The lightly doped layer of the first conductivity type is a highly resistive layer that increases the forward voltage and the ON-resistance. When the lightly doped layer of the first conductivity type is thick, depletion layers tend to expand and the expanded depletion layers narrow the current path, causing the JFET effect. Therefore, the forward voltage and the ON-resistance are increased.

Advantageously the second surface of the layer with low electrical resistance and the second surface of the pn-laminate (the major surfaces) are parallel to a (110) plane of a silicon crystal. When the major surface is a (110) plane of a silicon crystal, impurity ions may be implanted by utilizing the channeling effect under the same acceleration voltage more than twice

BRIEF DESCRIPTION OF THE DRAWING FIGURES

FIG. 1(*b*) is a cross section of a modification of the diode according to the first embodiment of the invention.

FIG. 2(*b*) is an impurity distribution profile taken along line II(*b*)—II(*b*) of FIG. 1(*a*).

FIG. 2(*c*) is an impurity distribution profile taken along line II(*c*)—II(*c*) of FIG. 1(*a*).

FIGS. 3(a) through 3(d) are cross sections describing the steps for manufacturing the diode with an alternating conductivity type layer according to the first embodiment of the invention.

Figure 4:
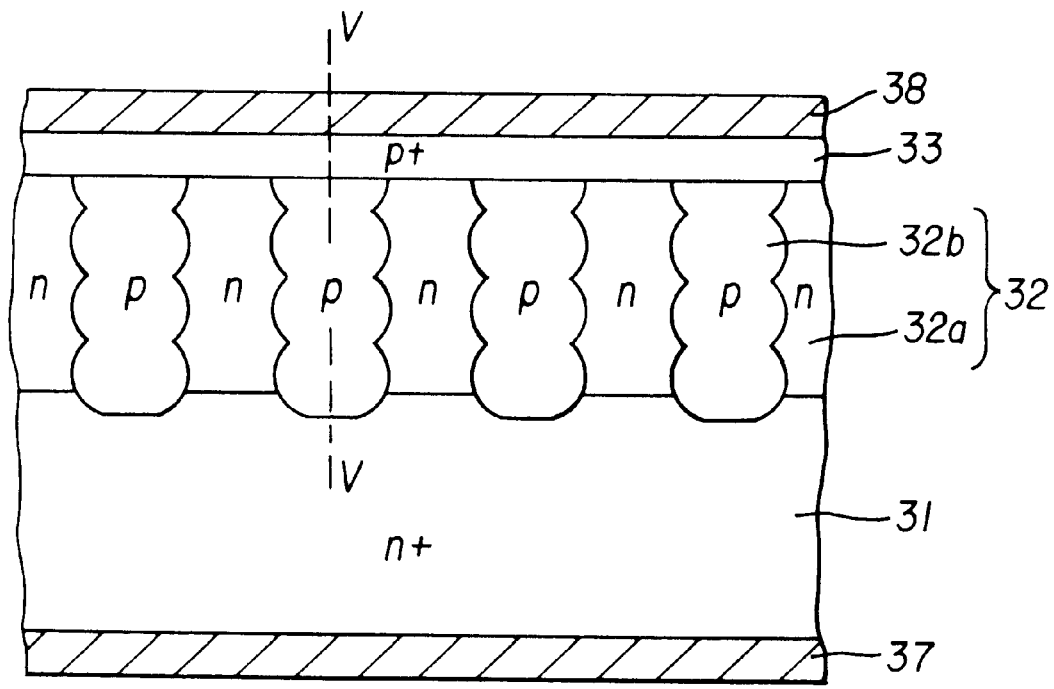

FIG. 4 is a cross section of a diode with an alternating conductivity type layer according to a second embodiment of the invention.

Figure 5:
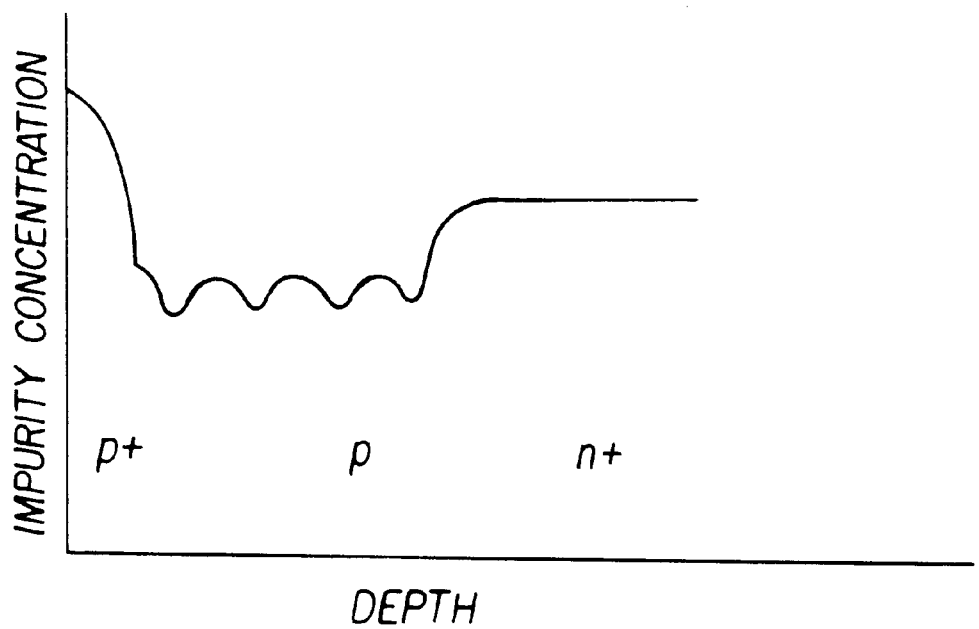

FIG. 5 is an impurity distribution profile taken along line V—V of FIG. 4.

FIGS. 6(a) through 6(e) are cross sections describing the steps for manufacturing a diode with an alternating conductivity type layer according to a third embodiment of the invention.

Figure 7:
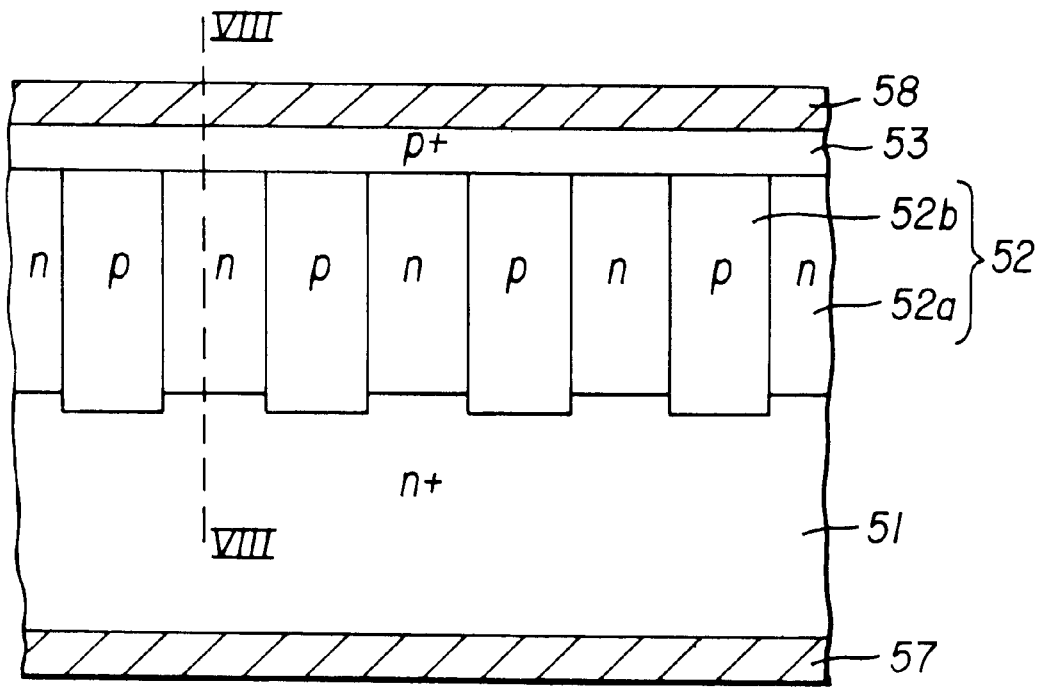

FIG. 7 is a cross section of a diode with an alternating conductivity type layer according to a fourth embodiment of the invention.

Figure 8:
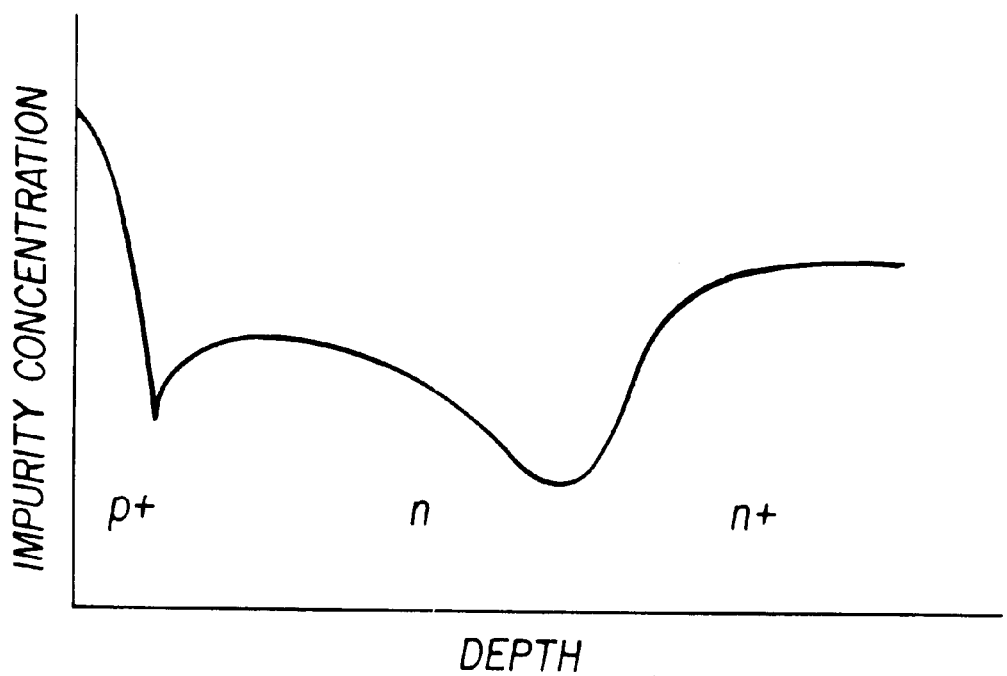

FIG. 8 is an impurity distribution profile taken along line VIII—VIII of FIG. 7.

FIGS. 9(a) through 9(e) are cross sections describing the steps for manufacturing the diode with an alternating conductivity type layer according to the fourth embodiment of the invention.

Figure 10:
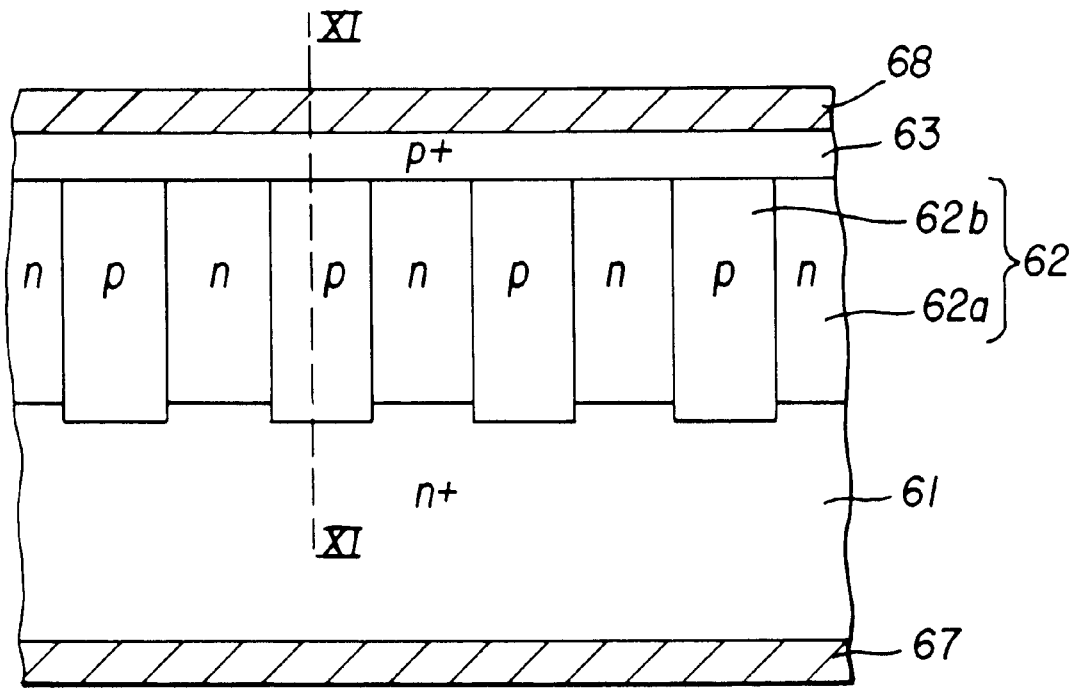

FIG. 10 is a cross section of a diode with an alternating conductivity type layer according to a fifth embodiment of the invention.

Figure 11:
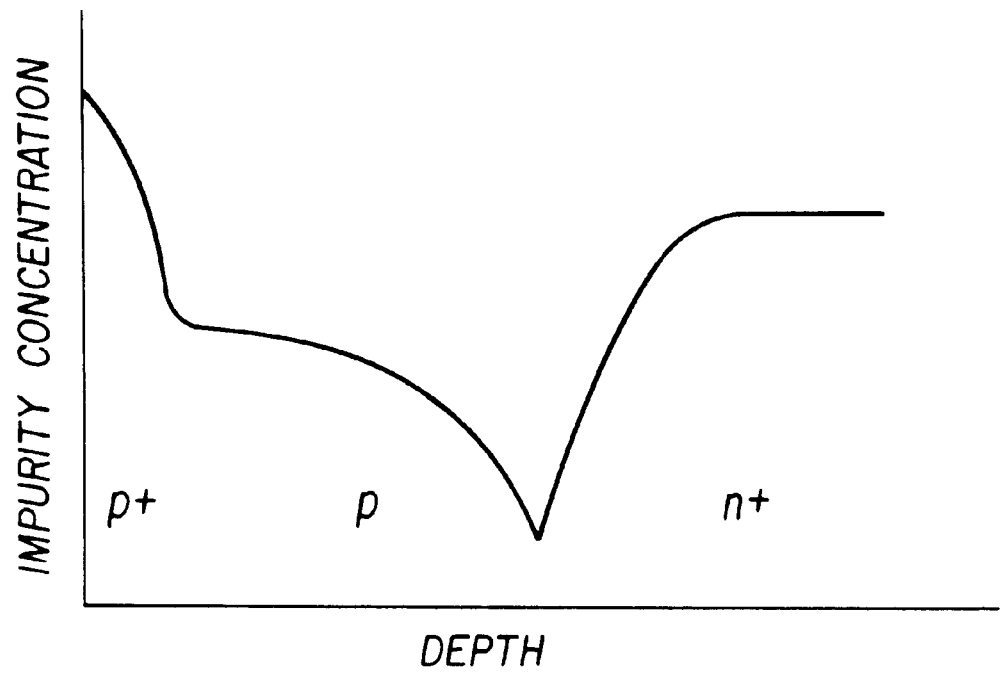

FIG. 11 is an impurity distribution profile taken along line XI—XI of FIG. 10.

Figure 12A:
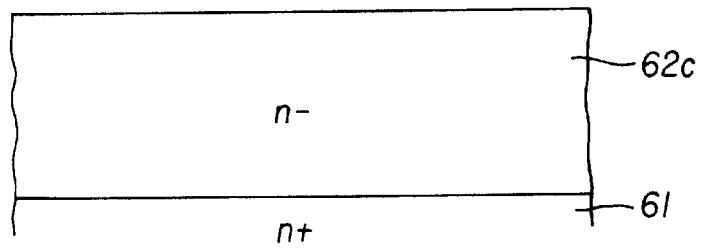
Figure 12B:
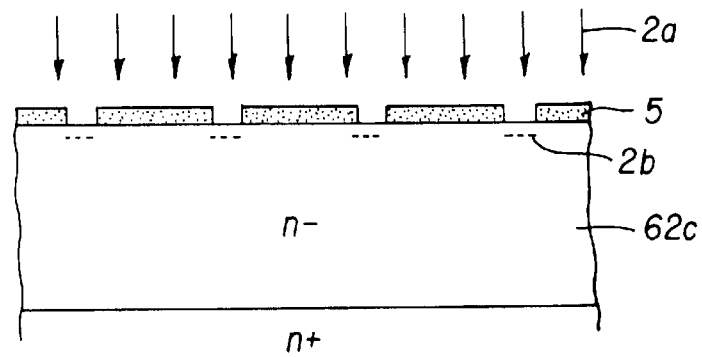
Figure 12C:
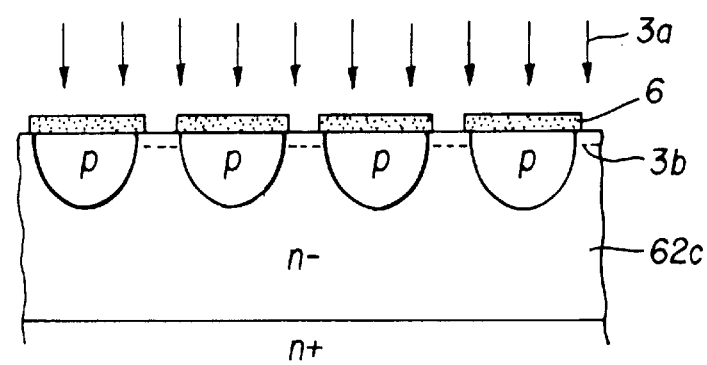

FIGS. 12(a) through 12(c) are cross sections describing the steps for manufacturing the diode with an alternating conductivity type layer according to the fifth embodiment of the invention.

Figure 13:
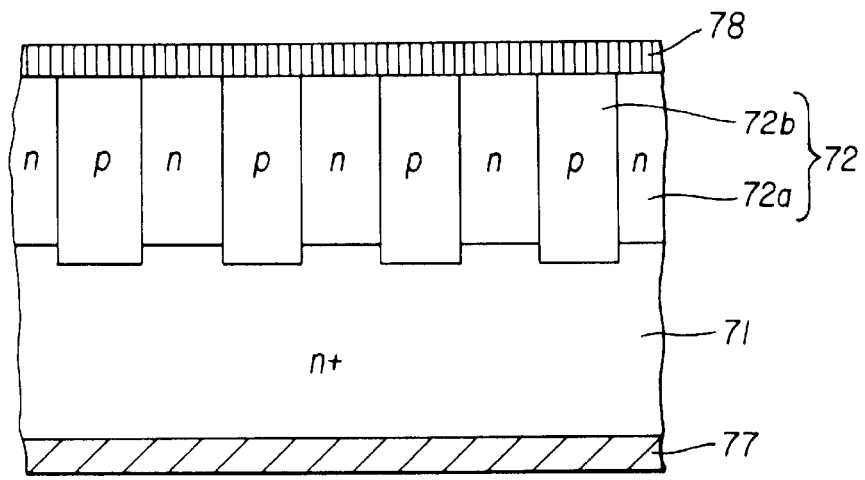

FIG. 13 is a cross section of a Schottky barrier diode with an alternating conductivity type layer according to a sixth embodiment of the invention.

Figure 14:
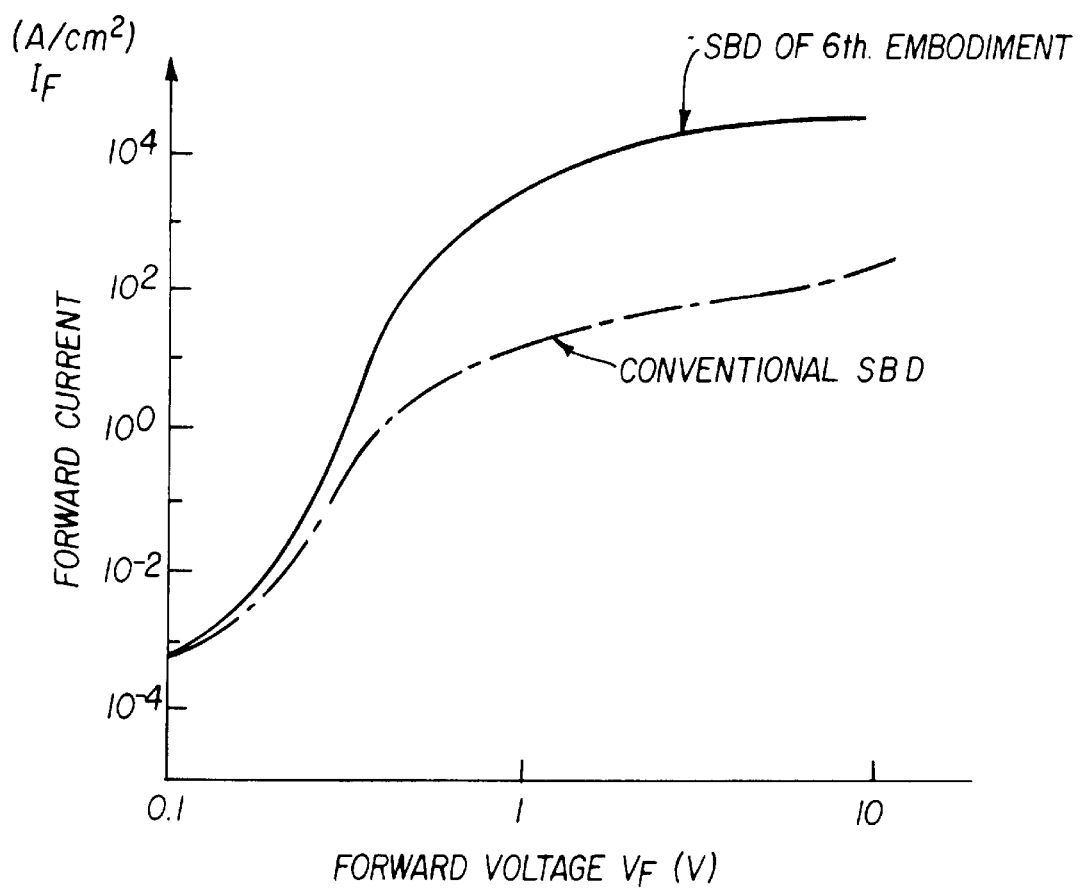

FIG. 14 is a pair of curves comparing the relationships between the forward voltage and the forward current in an exemplary Schottky barrier diode fabricated in the same way as the diode of the first embodiment and in a conventional Schottky barrier diode.

Figure 15:
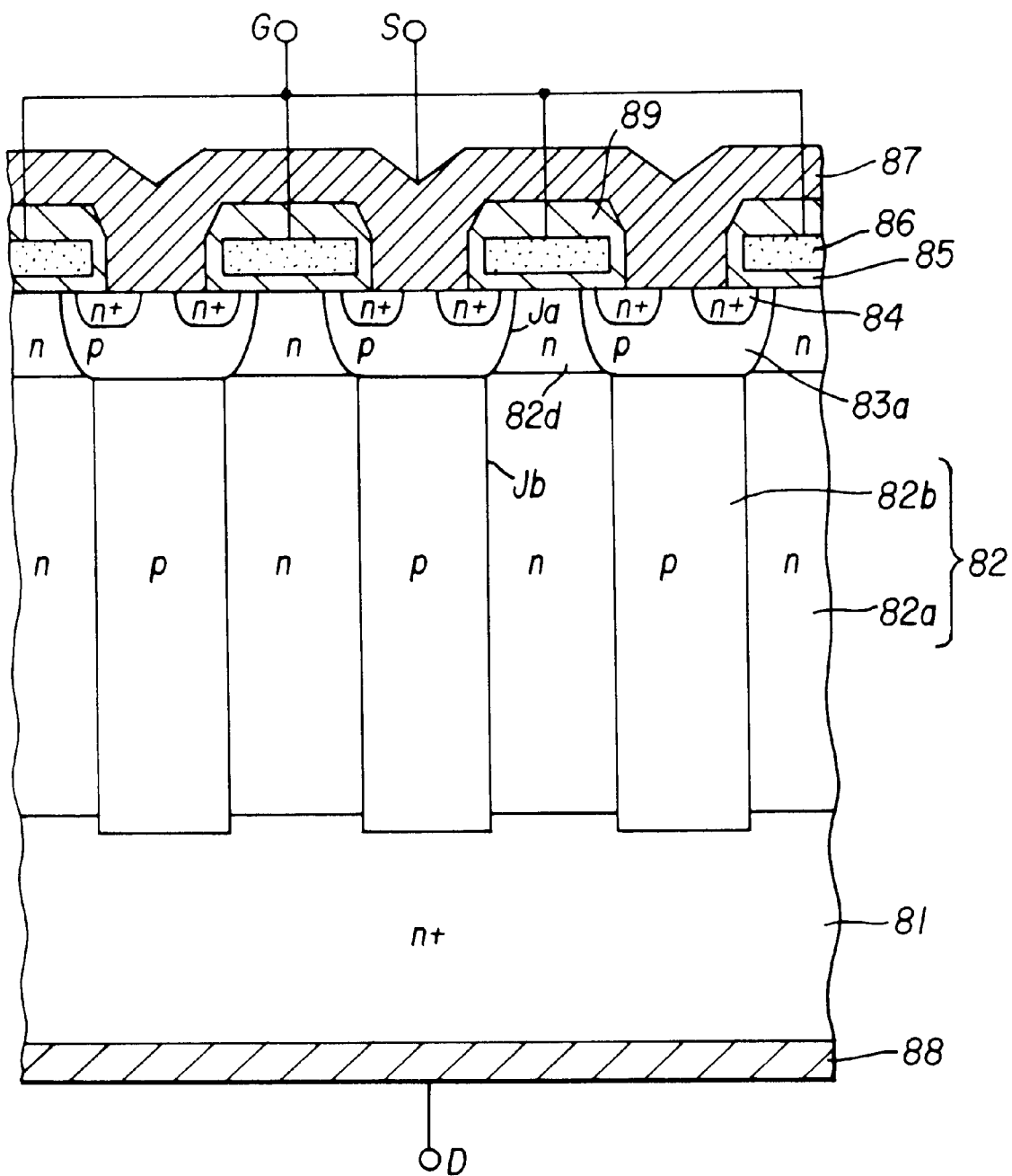

FIG. 15 is a cross section of a MOSFET with an alternating conductivity type layer according to a sixth embodiment of the invention.

Figure 16:
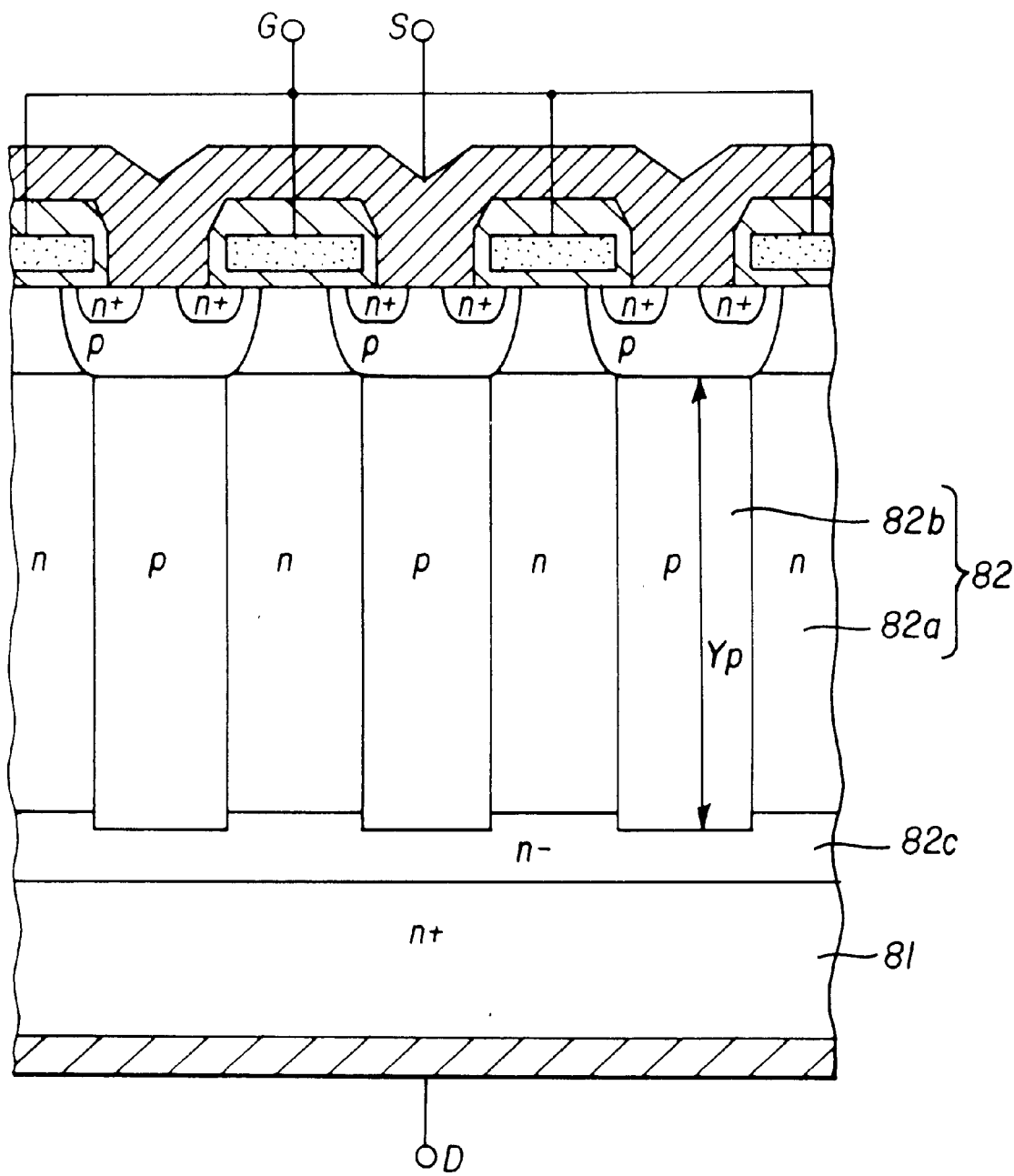

FIG. 16 is a cross section of a modification of the MOSFET of FIG. 15.

Figure 17:
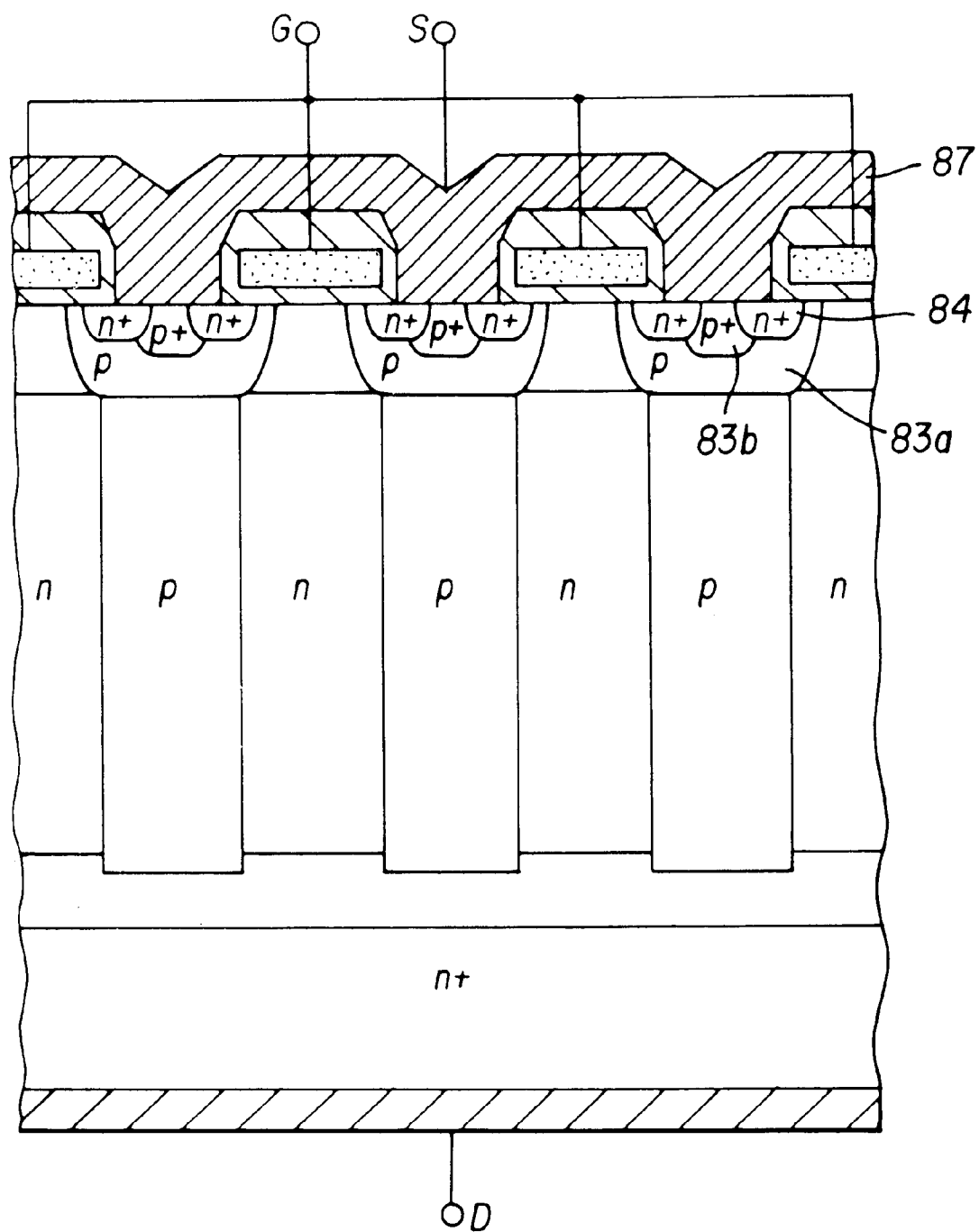

FIG. 17 is a cross section of another modification of the MOSFET of FIG. 15.

Figure 18:
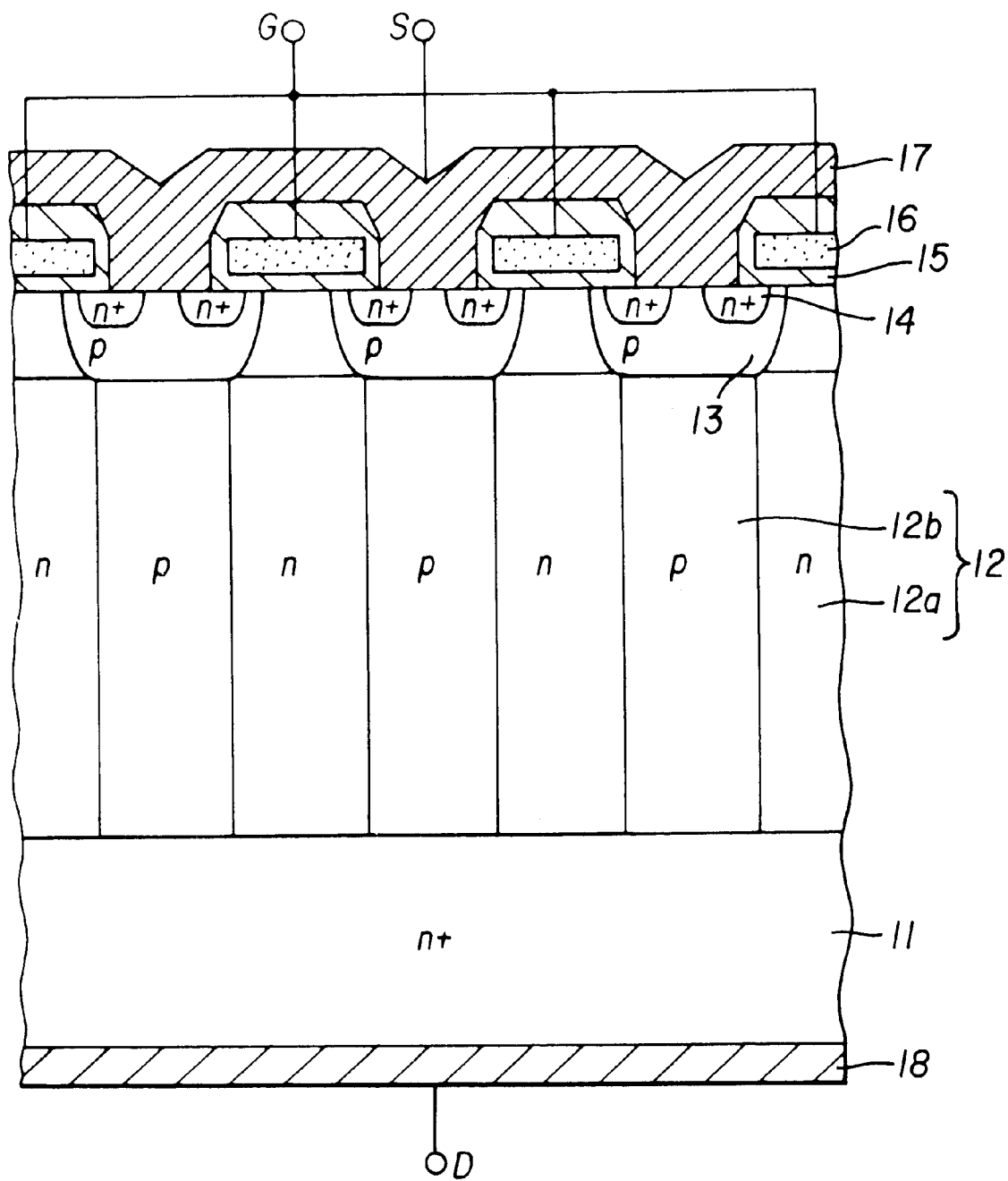

FIG. 18 is a cross section of a part of the vertical MOSFET according to an embodiment of U.S. Pat. No. 5,216,275.

DETAILED DESCRIPTION OF THE PREFERRED EMBODIMENTS

Now the present invention will be described hereinafter with reference to the accompanied drawing figures which illustrate the preferred embodiments of the invention. In the following, the region or the layer described by "n-type" is a region or a layer, wherein electrons are majority carriers. The region or the layer described by "p-type" is a region or a layer, wherein holes are majority carriers. The region or the layer described by "+" after "n" and "p" is a region or a layer doped relatively heavily. The region or the layer described by "−" after "n" and "p" is a region or a layer doped relatively lightly.

First Embodiment

Figure 1A:
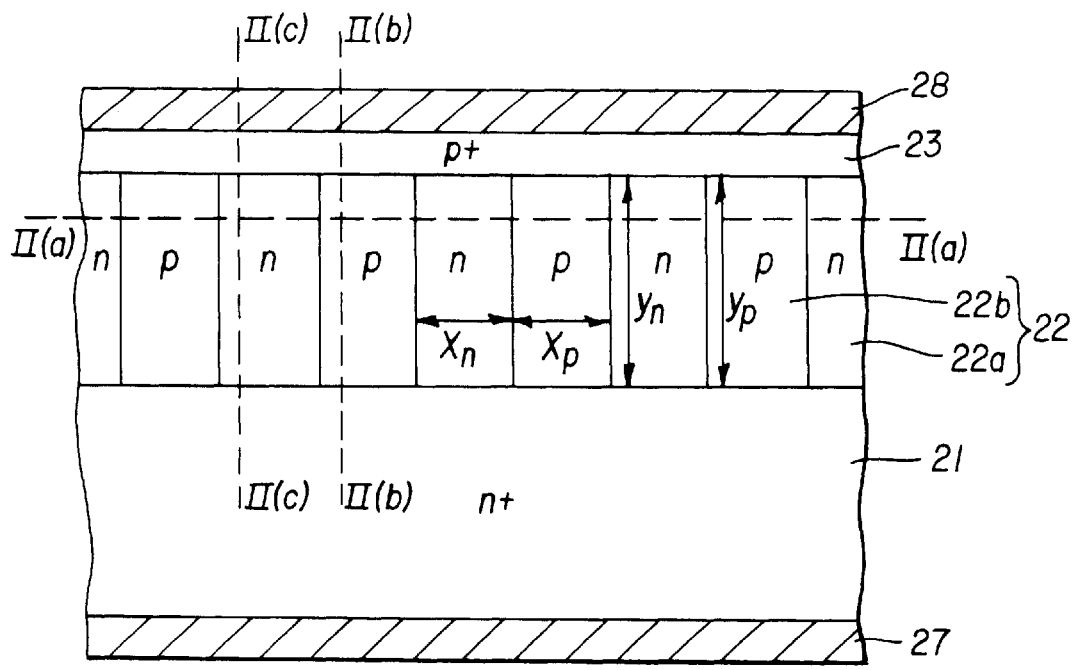
FIG. 1(*a*) is a cross section of a diode with an alternating conductivity type layer according to a first embodiment of the invention.

FIG. 1(a) is a cross section of a diode with an alternating conductivity type layer according to a first embodiment of the invention. The diode of FIG. 1(a) has a portion, that bears the breakdown voltage, in the circumference thereof in addition to the illustrated portions. Since the portion that bears the breakdown voltage has a guard ring structure or a field plate structure similar to those of usual semiconductor devices, the explanations thereof will be omitted.

Referring now to FIG. 1(a), a laminate 22 is formed on an n$^+$-type cathode layer 21. Laminate 22, including n-type drift regions 22a and p-type partition regions 22b alternately arranged with each other laterally, will be referred to as the "drift layer" for the sake of convenience. A p$^+$-type anode layer 23 is formed on drift layer 22. An anode 28 is in contact with p$^+$-type anode layer 23. A cathode 27 is in contact with n$^+$-type cathode layer 21. The n-type drift region 22a and p-type partition region 22b are shaped with stripes extending horizontally.

When a forward bias voltage is applied, holes are injected from p$^+$-type anode layer 23 to n-type drift regions 22a and electrons are injected from n$^+$-type cathode layer 21 to p-type partition regions 22b. The injected holes and electrons cause conductivity modulation, resulting in a current flow.

When a reverse bias voltage is applied, depletion layers expand into drift layer 22 formed of n-type drift regions 22a and p-type partition regions 22b arranged in parallel with each other. The depleted drift layer 22 bears the breakdown voltage. Especially when drift layer 22 is formed of n-type drift regions 22a and p-type partition regions 22b alternately arranged with each other, depletion layers expand laterally to an n-type drift region 22a and an adjacent p-type partition region 22b from the pn-junction therebetween. In addition, a depletion layer expands to n-type drift region 22a from the other adjacent p-type partition region 22b and a depletion layer expands to p-type partition region 22b from the other adjacent n-type drift region 22a. Thus, drift layer 22 is depleted very quickly. Therefore, n-type drift regions 22a may be doped more heavily.

The width $x_n$ of n-type drift region 22a and the width $x_p$ of p-type partition region 22b are set to be smaller than the respective depths $y_n$ and $y_p$. When the widths $x_n$, $x_p$ are set with respect to the depths $y_n$, $y_p$ as described above, since the depletion layers expand first for the full widths of n-type drift regions 22a and p-type partition region 22b and, then, downwards, a high breakdown voltage may be borne by a narrow area. When the widths $x_n$ and $x_p$ are equal, the depletion is promoted.

Figure 2A:
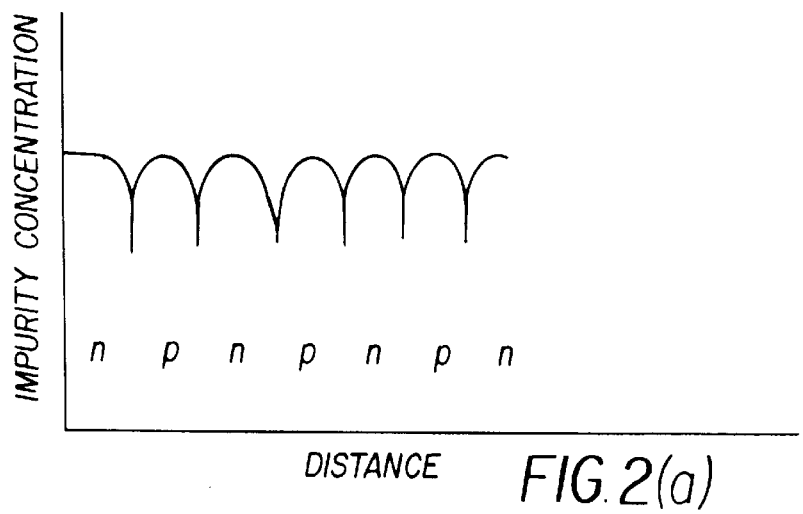
FIG. 2(*a*) is an impurity distribution profile taken along line II(*a*)—II(*a*) of FIG. 1(*a*).
Figure 2B:
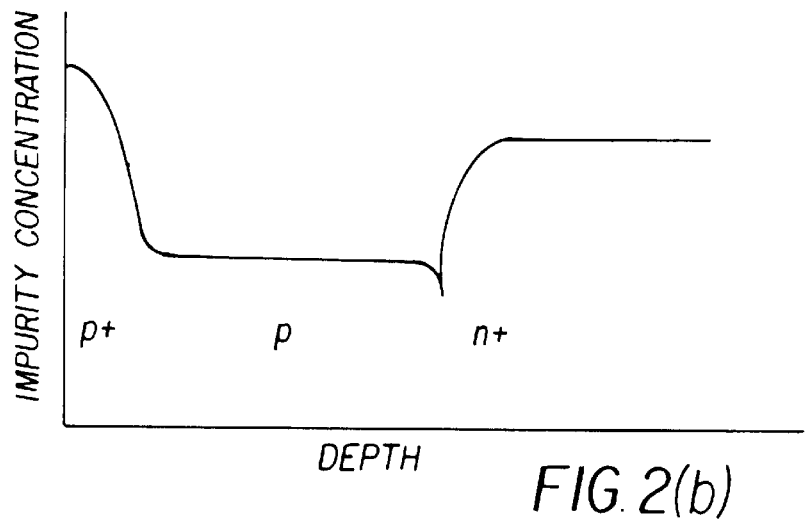
Figure 2C:
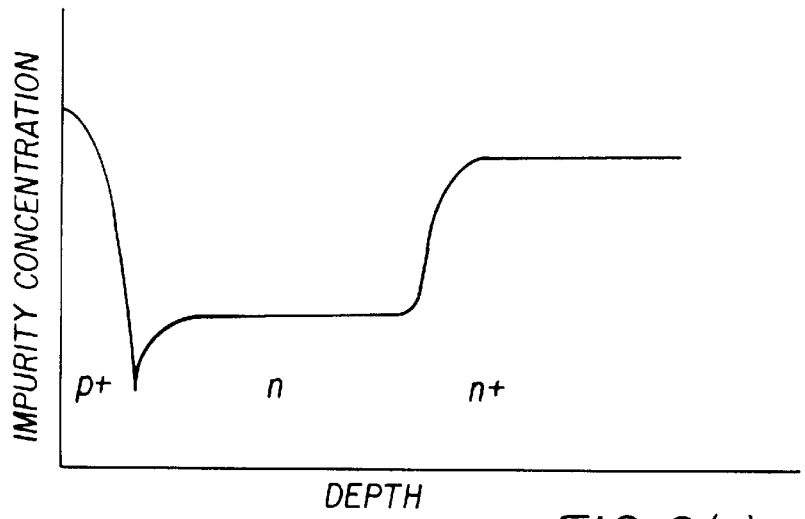

FIG. 2(a) is an impurity distribution profile taken along line II(a)—II(a) of FIG. 1(a). FIG. 2(b) is an impurity distribution profile taken along line II(b)—II(b) of FIG. 1(a). FIG. 2(c) is an impurity distribution profile taken along line II(c)—II(c) of FIG. 1(a). In these figures, the vertical axis represents the logarithmic impurity concentration. Referring now to FIG. 2(a), the impurity distributions in n-type drift regions 22a and p-type partition regions 22b arranged alternately are repeated. Since n-type drift regions 22a are formed by epitaxial growth, the impurity distribution therein is almost uniform. Since p-type partition regions 22b are formed by ion implantation and by subsequent heat treatment, concentration gradients are caused in the edge portions thereof. In FIG. 2(b), the impurity gradient caused by the diffusion from the surface of p$^+$-type anode layer 23, the almost uniform impurity distribution across p-type partition region 22b and the impurity distribution across n$^+$-type cathode layer 21 with low electrical resistance are shown. In FIG. 2(c), the impurity gradient caused by the diffusion from the surface of p$^+$-type anode layer 23, the almost uniform impurity distribution across n-type drift region 22a and the impurity distribution across n+-type cathode layer 21 with low electrical resistance are shown.

The dimensions and the impurity concentrations for an exemplary diode of the 300 V class are as follows. The specific resistance of n+-type cathode layer 21 is 0.01 Ω·cm. The thickness of n+-type cathode layer 21 is 350 μm. The width $x_n$ of n-type drift region 22a is 3 μm. The specific resistance of n-type drift region 22a is 0.3 μcm, corresponding to the impurity concentration of $2 \times 10^{16}$ cm$^{-3}$. The width $x_p$ of p-type partition region 22b is 3 μm. The spacing between the centers of the regions with the same conductivity type is 6 μm. The average impurity concentration of p-type partition region 22b is $2 \times 10^{16}$ cm$^{-3}$. The thickness of drift layer 22 is 10 μm. The diffusion depth of p+-type anode layer 23 is 1 μm. The surface impurity concentration of p+-type anode layer 23 is $5 \times 10^{19}$ cm$^{-3}$. To deplete the pn-laminate of the alternately arranged n-type drift regions 22a and p-type partition regions 22b in the OFF-state of the device, it is necessary for the impurity amounts in the regions of both conductivity types to be almost the same. If the impurity concentration in the regions of one conductivity type is half the impurity concentration in the regions of the opposite conductivity type, the regions of one conductivity type should be twice wider than the regions of the opposite conductivity type. When the impurity concentrations in the regions of both conductivity types are the same, the semiconductor surface is utilized most efficiently, since it is enough for the regions of one conductivity type to be as wide as the regions of the opposite conductivity type.

FIGS. 3(a) through 3(d) are cross sections describing the steps for manufacturing the diode with an alternating conductivity type layer according to the first embodiment of the invention.

Figure 3A:
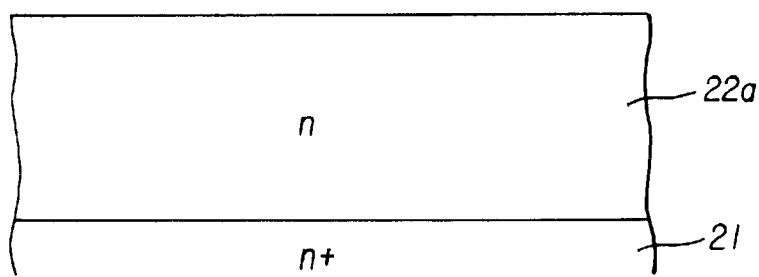

Referring now to FIG. 3(a), an n-type drift layer 22a is grown epitaxially on an n+-type cathode layer 21 that works as an n-type substrate with low electrical resistance.

Figure 3B:
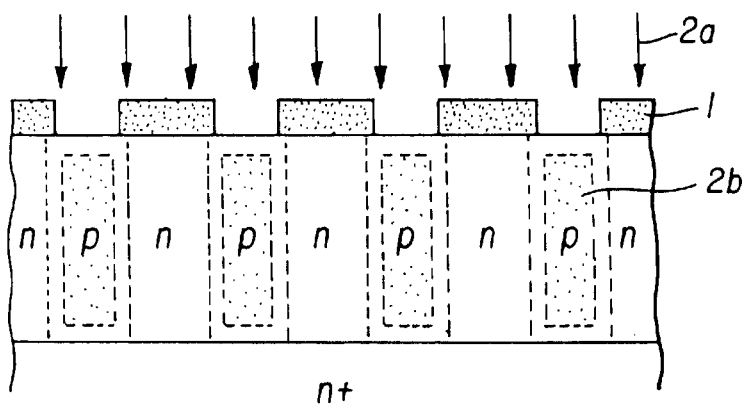

Referring now to FIG. 3(b), a first mask 1 is formed on n-type drift layer 22a by depositing a wolfram film of 3 μm in thickness by a CVD method and by subsequent photolithographic pattering. Since implanted ions distribute more widely than the width of the windows of the mask, the width of the windows should be set carefully.

Figure 3C:
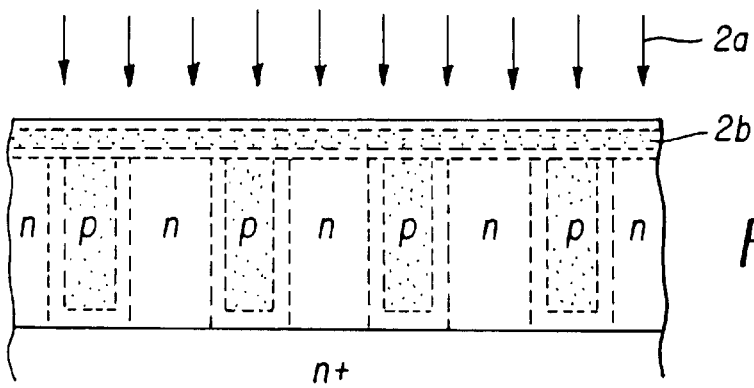

Referring now to FIG. 3(c), boron (B) ions 2a are implanted. The acceleration voltage for the ion implantation is changed continuously between 100 keV and 10 MeV so that the concentration of implanted B ions 2b may be uniform $2 \times 10^{16}$ cm$^{-3}$.

The first mask 1 is removed and B ions 2a for forming a p+-type anode layer 23 are implanted under the acceleration voltage of 100 keV and at the dose amount of $3 \times 10^{15}$ cm$^{-2}$.

Figure 3D:
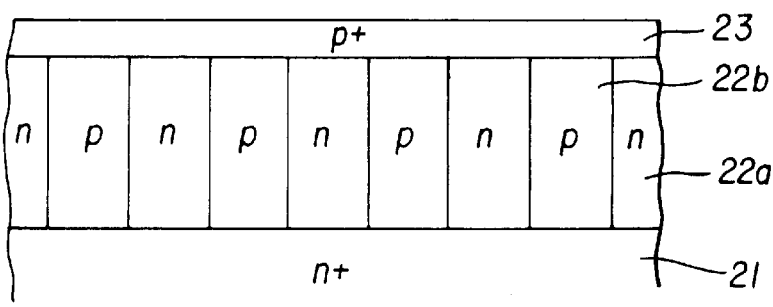

Referring now to FIG. 3(d), the semiconductor compact formed so far is treated thermally at 1000° C. for 1 hr to activate the implanted impurity ions, to anneal out defects and to form n-type drift regions 22a, p-type partition regions 22b and p+-type anode layer 23. Then, a cathode 27 and an anode 28 are formed to complete the diode with an alternating conductivity type layer according to the first embodiment of the invention.

Since the maximum acceleration voltage of the ion implantation is set at a high value and since the acceleration voltage of the ion implantation is varied continuously for forming p-type partition regions 22b, deep and smooth pn-junction planes are formed between p-type partition regions 22b and n-type drift regions 22a.

When a specific crystal orientation such as a (110) plane of a silicon crystal is selected, an ion implanted region more than twice deeper than that by the usual ion implantation is formed by utilizing the channeling effect of the implanted ions.

In the diode with an alternating conductivity type layer according to the first embodiment, n-type drift regions 22a and p-type partition regions 22b have almost the same dimensions and almost the same impurity concentrations. When a reverse bias voltage is applied to the diode with an alternating conductivity type layer according to the first embodiment, drift layer 22 is depleted to bear the breakdown voltage.

To provide conventional diodes that include a single-layered highly resistive drift layer with a breakdown voltage of the 300 V class, it is necessary for the single-layered highly resistive drift layer to have an impurity concentration of $2 \times 10^{14}$ cm$^{-3}$ and a thickness of about 40 μm. In the diode with an alternating conductivity type layer according to the first embodiment, the ON-resistance thereof is reduced to one fifth of that of the conventional diodes by increasing the impurity concentration in n-type drift regions 22a and by reducing the thickness of drift layer 22 corresponding to the increment of the impurity concentration.

As explained above, the diode with an alternating conductivity type layer that exhibits a high breakdown voltage and a low forward voltage is manufactured easily by the well established techniques such as epitaxial growth, ion implantation and thermal diffusion without the need to form trenches with a large aspect ratio and filling each trench with a high quality epitaxial layer.

By further narrowing n-type drift regions 22a and by increasing the impurity concentration therein, the ON-resistance and the tradeoff relation between the ON-resistance and the breakdown voltage are further reduced.

Figure 1B:
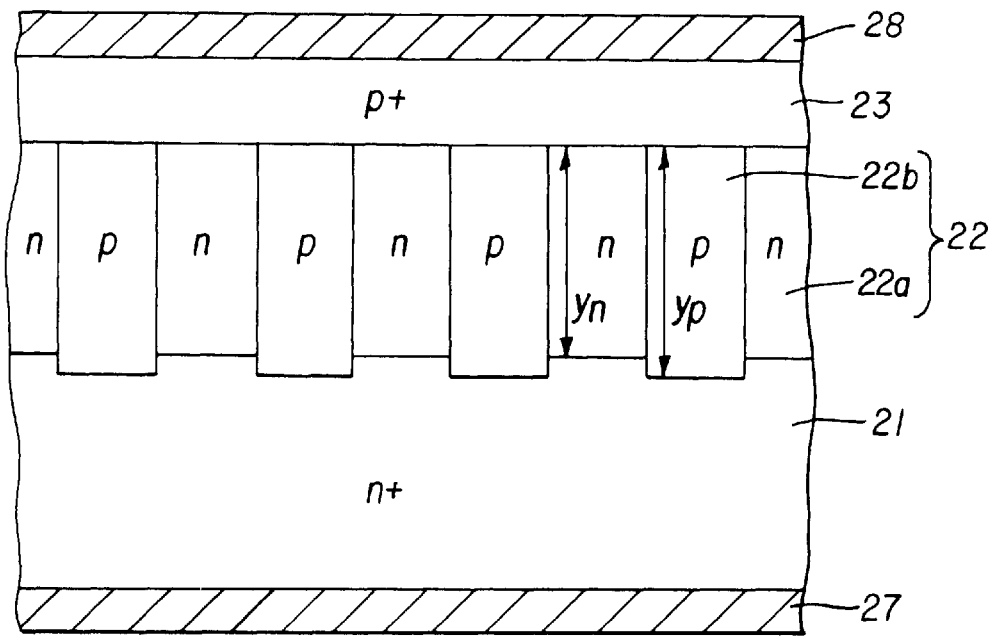

FIG. 1(b) is a cross section of a modification of the diode with an alternating conductivity type layer according to the first embodiment of the invention. The modified diode in FIG. 1(b) is different from the diode of FIG. 1(a) in that the depth $y_p$ of p-type partition regions 22b is larger than the depth $y_n$ of n-type drift regions 22a in the modified diode.

If the depth $y_p$ of p-type partition regions 22b is smaller than the depth $y_n$ of n-type drift regions 22a, n-type drift regions 22a will be extended below p-type partition regions 22b. The extended portions of n-type drift regions 22a will not be completely depleted, causing a reduced breakdown voltage. To avoid this problem, it is preferable to deepen p-type partition regions 22b more than n-type drift regions 22a and to extend p-type partition regions 22b down to n+-type cathode layer 21.

However, it is not so effective to set the depth $y_p$ much larger than the depth $y_n$. As a reference, it is preferable to set the depth $y_p$ larger by about 20% than the depth $y_n$. That is, it is preferable to set the depths $y_p$ and $y_n$ so that a relational expression $y_n < y_p \leq \ldots 1.2\, y_n$ may hold. By setting the depths $y_p$ and $y_n$ as described above, the breakdown voltage is borne by the pn-laminate and the forward voltage is reduced.

The p-type partition regions 22b are deepened by increasing the acceleration voltage for the ion implantation. A diode with a higher breakdown voltage may be manufactured by further increasing the acceleration voltage for the ion implantation.

The arrangement of n-type drift regions 22a and p-type partition regions 22b is not limited to the planar stripe arrangement described in connection with the first embodiment. The n-type drift regions and the p-type partition regions in the following embodiments may be arranged in a lattice pattern, a net pattern, a honey comb pattern and such patterns.

First, a p-type partition layer may be grown epitaxially, and, then, donor impurity ions are implanted into the p-type partition layer to form n-type drift regions 22a between p-type partition regions 22b.

Second Embodiment

FIG. 4 is a cross section of a diode with an alternating conductivity type layer according to a second embodiment of the invention.

Referring now to FIG. 4, the diode with an alternating conductivity type layer according to the second embodiment includes p-type partition regions 32b, the shape thereof is different from that of p-type partition regions 22b according to the first embodiment. In the figure, the boundaries between n-type drift regions 22a and p-type partition regions 22b are represented by curves (curved surfaces three-dimensionally).

FIG. 5 is an impurity distribution profile taken along line V—V of FIG. 4. In the figure, the vertical axis represents the logarithmic impurity concentration. In FIG. 5, an impurity concentration gradient across a p$^+$-type anode layer 33 is followed by a cyclic change of the impurity concentration caused by the diffusion form the different impurity sources for forming p-type partition regions 32b. The cyclically changing impurity concentration distribution continues to an impurity concentration distribution across an n$^+$-type cathode layer 31. Since n-type drift regions 32a are formed epitaxially, the impurity concentration distribution is almost uniform across n-type drift region 32a similarly as shown in FIG. 2(c).

The diode according to the second embodiment is manufactured, at first, through the steps described with reference to FIGS. 3(a) and 3(b). However, the acceleration voltage for B ion implantation is not changed continuously. Boron ions 2 are implanted multiple times by changing the acceleration voltage stepwise in such an ascending order as 100 keV, 200 keV, 500 keV, 1 MeV, 2 MeV, 5 MeV and 10 MeV.

Thus, the diode with an alternating conductivity type layer according to the second embodiment that exhibits a high breakdown voltage and a low forward voltage is manufacture easily by the well established techniques such as epitaxial growth, ion implantation and thermal diffusion.

In manufacturing a semiconductor device with a low breakdown voltage, its thin drift layer may be formed by single step ion implantation.

Third Embodiment

A diode with an alternating conductivity type layer as shown in FIG. 1(b) may be manufactured by a different manufacturing method.

FIGS. 6(a) through 6(e) are cross sections describing the steps for manufacturing a diode with an alternating conductivity type layer according to a third embodiment of the invention.

Figure 6A:
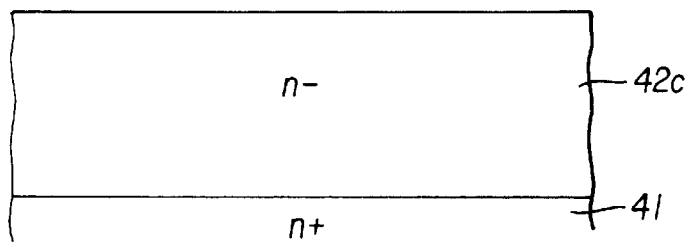

Referring now to FIG. 6(a), an n$^+$-type cathode layer 41 is formed by diffusing donor impurities deeply from a surface of a highly resistive n-type wafer. A highly resistive n$^-$-type layer 42c is now on n$^+$-type cathode layer 41. Impurities may be diffused into opposing surface portions of a highly resistive n-type wafer and, then, one of the diffusion regions may be removed.

Figure 6B:
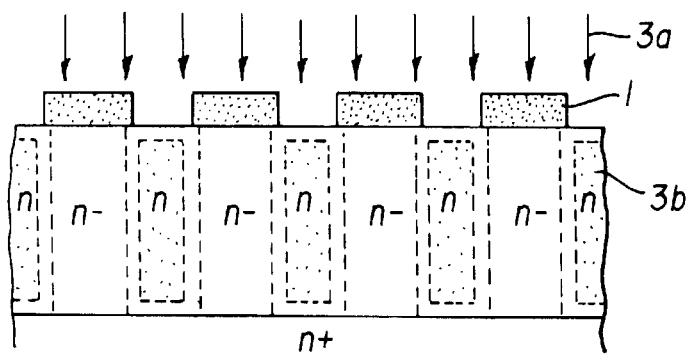

Referring now to FIG. 6(b), a wolfram film of 3 μm in thickness is deposited on n$^-$-type layer 42c, for example, by a CVD method. The deposited wolfram film is patterned by photolithography, resulting in a first mask 1. Phosphorus ions (P ions) 3a are implanted into the n$^-$-type layer 42c through the windows of the first mask 1 by changing the acceleration voltage between 100 keV and 15 MeV so that the concentration of implanted P ions 3b may be $2\times10^{16}$ cm$^{-3}$ uniformly in the implanted regions.

Figure 6C:
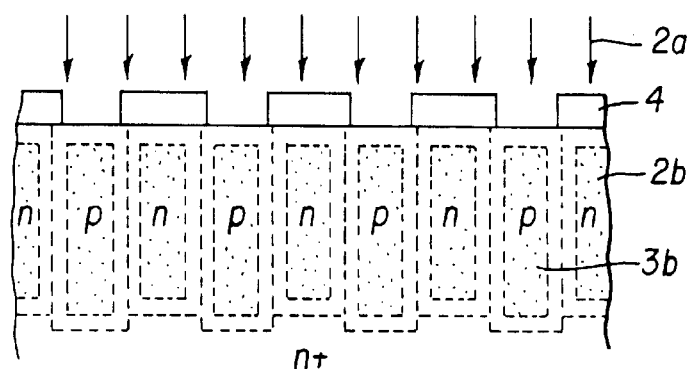

Referring now to FIG. 6(c), the first mask 1 is removed. Then, a second mask 4 is formed in the same way as the first mask 1. Boron ions 2a are implanted into n$^-$-type layer 42c through the windows of the second mask 4 by changing the acceleration voltage between 100 keV and 10 MeV so that the concentration of implanted B ions 2b may be $2\times10^{16}$ cm$^{-3}$ uniformly in the implanted regions.

Figure 6D:
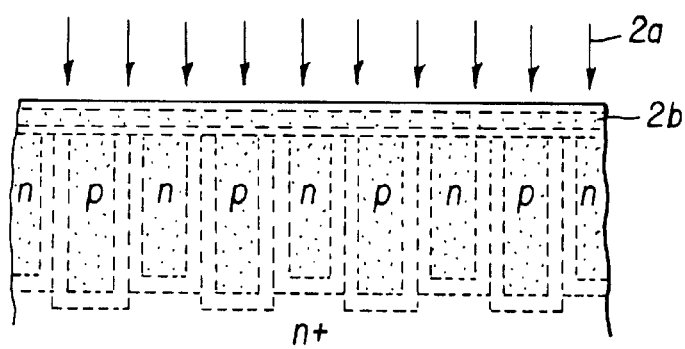

Referring now to FIG. 6(d), the second mask 4 is removed. A p$^+$-type anode layer 43 is formed by implanting B ions 2a under the acceleration voltage of 100 keV and at the dose amount of $3\times10^{15}$ cm$^{-2}$.

Figure 6E:
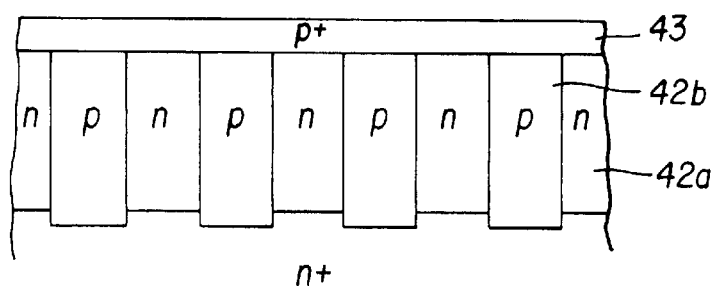

Referring now to FIG. 6(e), the semiconductor compact formed so far is treated thermally at 1000° C. for 1 hr to activate the implanted impurity ions, to anneal out defects and to form n-type drift regions 42a, p-type partition regions 42b and p$^+$-type anode layer 43. The highly resistive n$^-$-type layer 42c is remaining not in the central part but only in the circumference of the diode to bear the breakdown voltage. Then, a cathode and an anode are formed to complete the diode with an alternating conductivity type layer according to the third embodiment of the invention.

Since the maximum acceleration voltages for the ion implantation are set at high values and since the acceleration voltages of the ion implantation are changed continuously, deep and smooth pn-junction planes are formed between p-type partition regions 42b and n-type drift regions 42a. Thus, the diode with an alternating conductivity type layer according to the third embodiment that exhibits a high breakdown voltage and a low forward voltage is manufacture easily by the well established techniques such as epitaxial growth, ion implantation and thermal diffusion.

Since the diode according to the third embodiment includes a drift layer 42 formed of n-type drift regions 42a and p-type partition regions 42b having almost the same dimensions and almost the same impurity concentrations, n-type drift layer 42 is depleted to bear the breakdown voltage when a reverse bias voltage is applied across the diode.

The configuration described above facilitates manufacturing the diode with an alternating conductivity type layer according to the third embodiment by the process including ion implantation and heat treatment as its main steps.

The n-type drift regions 42a and p-type partition regions 42b may be formed by implanting respective impurities to almost the same depths as shown in FIG. 1(a). Or, n-type drift regions 42a and p-type partition regions 42b may be formed by implanting respective impurities under acceleration voltages changed stepwise in the same way as in the second embodiment.

The n$^+$-type cathode layer 41 is formed by diffusing impurity ions into a highly resistive layer that works as a highly resistive n$^-$-type layer 42c according to the third embodiment. Alternatively, an epitaxial wafer including a highly resistive n$^-$-type layer 42c formed epitaxially on a substrate with low electrical resistance that works as an n$^+$-type cathode layer 41 may be used.

Fourth Embodiment

FIG. 7 is a cross section of a diode with an alternating conductivity type layer according to a fourth embodiment of the invention.

Referring now to FIG. 7, the diode with an alternating conductivity type layer according to the fourth embodiment of the invention includes an n$^+$-type cathode layer 51, a drift layer 52 formed of n-type drift regions 52a and p-type partition regions 52b, a p$^+$-type anode layer 53 formed on drift layer 52, an anode 58 in contact with p$^+$-type anode layer 53, and a cathode 57 in contact with n$^+$-type cathode layer 51.

Although FIG. 7 resembles FIG. 1(b), the internal semiconductor structure of the diode shown in FIG. 7 is different from that of the diode shown in FIG. 1(b), since their manufacturing methods are different from each other. In the diode shown in FIG. 1(b), since n-type drift regions 22a are formed epitaxially, the impurity distribution therein is uniform. Since n-type drift regions 52a are formed by diffusing impurity ions from a surface of a highly resistive substrate, the impurity concentration in n-type drift regions 52a shows distribution caused by the diffusion.

FIG. 8 is an impurity distribution profile taken along line VIII—VIII of FIG. 7. In the figure, the vertical axis represents the logarithmic impurity concentration. Referring now to FIG. 8, impurity concentration distributions across p$^+$-type anode layer 53, n-type drift region 52a and n$^+$-type cathode layer 51 are shown.

FIGS. 9(a) through 9(e) are cross sections describing the steps for manufacturing the diode with an alternating conductivity type layer according to the fourth embodiment of the invention.

Referring now to FIG. 9(a), an n$^+$-type cathode layer 51 is formed by diffusing donor impurities deeply from a surface of a highly resistive n-type wafer. A highly resistive n$^-$-type layer 52c is now on n$^+$-type cathode layer 51. Phosphorus ions (P ions) 3a are implanted into the surface portion of n$^-$-type layer 52c under the acceleration voltage of 100 keV and at the dose amount of $2 \times 10^{13}$ cm$^{-2}$.

Referring now to FIG. 9(b), an n-type drift layer 52a is formed by diffusing the implanted P ions at 1250° C. for 10 hrs so that n-type drift layer 52a may reach n$^+$-type cathode layer 51. Therefore, highly resistive n$^-$-type layer 52c is remaining not in the central part but only in the circumference of the diode to bear the breakdown voltage.

Referring now to FIG. 9(c), a wolfram film of 3 μm in thickness is deposited on n-type drift layer 52a by a CVD method. The deposited wolfram film is patterned by photolithography, resulting in a first mask 1. Boron ions (B ions) 2a are implanted into n-type drift layer 52a through the windows of the first mask 1 by changing the acceleration voltage between 100 keV and 10 MeV so that the concentration of implanted B ions 2b in p-type partition regions 52b may be $2 \times 10^{16}$ cm$^{-3}$ uniformly in the implanted regions.

Referring now to FIG. 9(d), the first mask 1 is removed. Then, B ions 2a are selectively implanted to form p-type anode layer 53.

Referring now to FIG. 9(e), the semiconductor compact formed so far is treated thermally at 1000° C. for 1 hr to activate the implanted impurity ions, to anneal out defects and to form n-type drift regions 52a, p-type partition regions 52b and p$^+$-type anode layer 53. Then, a cathode and an anode are formed to complete the diode with an alternating conductivity type layer according to the fourth embodiment of the invention.

The dimensions and the impurity concentrations for an exemplary diode of the 300 V class are as follows. The surface impurity concentration of n$^+$-type cathode layer 51 is $3 \times 10^{20}$ cm$^{-3}$. The diffusion depth for n$^+$-type cathode layer 51 is 200 μm. The width of n-type drift region 52a is 3 μm. The surface impurity concentration of n-type drift region 52a is $1 \times 10^{17}$ cm$^{-3}$. The diffusion depth for n-type drift region 52a is 10 μm. The width of p-type partition region 52b is 3 μm. The average impurity concentration of p-type partition region 52b is $2 \times 10^{16}$ cm$^{-3}$. The diffusion depth for p$^+$-type anode layer 53 is 1 μm. The surface impurity concentration of p$^+$-type anode layer 53 is $5 \times 10^{19}$ cm$^{-3}$.

Thus, the diode with an alternating conductivity type layer according to the fourth embodiment that exhibits a high breakdown voltage and a low forward voltage is manufacture easily by the well established techniques such as epitaxial growth, ion implantation and thermal diffusion.

Alternatively, a p-type partition layer 52b is formed by diffusion. Then, donor impurity ions are implanted to p-type partition layer 52b so that n-type drift regions 52a may be formed between p-type partition regions 52b.

An epitaxial wafer including a highly resistive n$^-$-type layer 52c formed epitaxially on a substrate with low electrical resistance that works as an n$^+$-type cathode layer 51 may be used.

The n-type drift regions 52a and p-type partition regions 52b may be formed by implanting respective impurities to almost the same depths as shown in FIG. 1(a). Or, n-type drift regions 52a and p-type partition regions 52b may be formed by implanting respective impurities under acceleration voltages changed stepwise in the same way as in the second embodiment.

Fifth Embodiment

FIG. 10 is a cross section of a diode with an alternating conductivity type layer according to a fifth embodiment of the invention.

Referring now to FIG. 10, the diode with an alternating conductivity type layer according to the fifth embodiment of the invention includes an n$^+$-type cathode layer 61, a drift layer 62 formed of n-type drift regions 62a and p-type partition regions 62b, a p$^+$-type anode layer 63 formed in the surface portion of drift layer 62, an anode 68 in contact with p$^+$-type anode layer 63, and a cathode 67 in contact with n$^+$-type cathode layer 61.

Although FIG. 10 resembles FIG. 1(b), the internal semiconductor structure of the diode shown in FIG. 10 is different from that of the diode shown in FIG. 1(b), since their manufacturing methods are different from each other. Since n-type drift regions 62a and p-type partition regions 62b are formed by diffusing respective impurity ions from a surface of a highly resistive wafer, the impurity concentrations in n-type drift regions 62a and p-type partition regions 62b show distributions caused by the diffusion.

FIG. 11 is an impurity distribution profile taken along line XI—XI of FIG. 10. In the figure, the vertical axis represents the logarithmic impurity concentration. Referring now to FIG. 11, impurity concentration distributions across p$^+$-type anode layer 63, p-type partition region 62b and n$^+$-type cathode layer 61 are shown. Although not illustrated, the impurity concentration distribution across n-type drift region 62a is similar to that across p-type partition region 62b.

FIGS. 12(a) through 12(d) are cross sections describing the steps for manufacturing the diode with an alternating conductivity type layer according to the fifth embodiment of the invention.

Referring now to FIG. 12(a), an n$^+$-type cathode layer 61 is formed by diffusing donor impurities deeply from a surface of a highly resistive n-type wafer. A highly resistive n⁻-type layer 62c is now on n⁺-type cathode layer 61.

Referring now to FIG. 12(b), an oxide film is deposited on n⁻-type layer 62c to form a first mask 5. Boron ions (B ions) 2a are implanted into n⁻-type layer 62c through the windows of the first mask 1 under the acceleration voltage of 100 keV and at the dose amount of $7 \times 10^{12}$ cm$^{-2}$. The implanted B ions are designated by the reference numeral 2b.

Referring now to FIG. 12(c), the implanted B ions 2b are treated thermally at 1200° C. for 30 hrs. Then, a second mask 6 is formed on the regions, wherein B ions are diffused. Then, phosphorous ions (P ions) 3a are implanted into n⁻-type layer 42c through the windows of the second mask 6 under the acceleration voltage of 100 keV and at the dose amount of $7 \times 10^{12}$ cm$^{-2}$. The implanted P ions are designated by the reference numeral 3b. Alternatively, the impurity ions may be doped by gas doping. First, the impurity ions, the diffusion coefficient thereof is small, are doped and thermally treated.

Figure 12D:
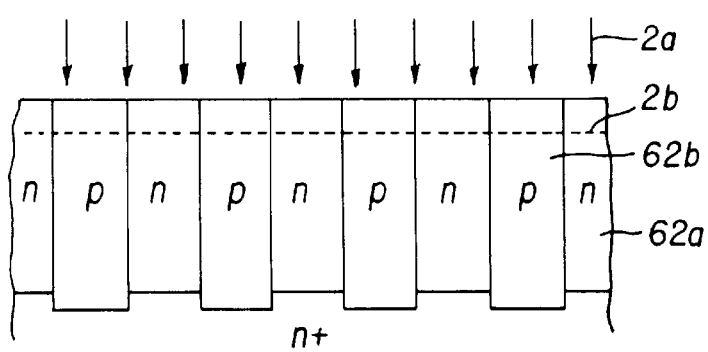

Referring now to FIG. 12(d), the B ions 2b and the P ions 3b are treated thermally at 1200° C. for 50 hrs to extend n-type drift regions 62a and p-type partition regions 62c down to n⁺-type cathode layer 61. The highly resistive n⁻-type layer 42c is remaining not in the central part but only in the circumference of the diode to bear the breakdown voltage. Then, B ions 2a are implanted to form p⁺-type anode layer 63.

Figure 12E:
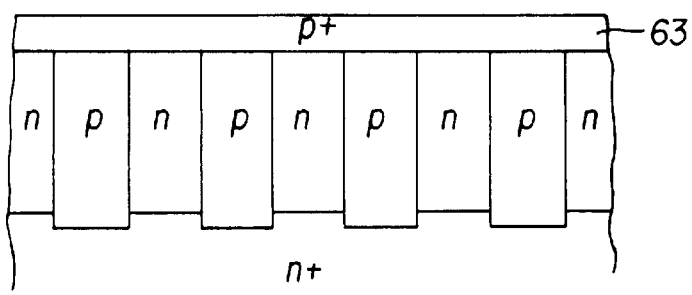

Referring now to FIG. 12(e), the semiconductor compact formed so far is treated thermally at 1000° C. for 1 hr to activate the implanted impurity ions, to anneal out defects and to form n-type drift regions 62a, p-type partition regions 62b and p⁺-type anode layer 63. Then, a cathode and an anode are formed to complete the diode with an alternating conductivity type layer according to the fifth embodiment of the invention.

Thus, the diode with an alternating conductivity type layer according to the fifth embodiment that exhibits a high breakdown voltage and a low forward voltage is manufacture easily by the well established techniques such as epitaxial growth, ion implantation and thermal diffusion.

The order of the manufacturing steps are set as described above, since the diffusion coefficient of B is smaller than that of P. Other combinations of a donor impurity and an acceptor impurity may be used. In such an occasion, periods of time for diffusion are selected appropriately considering the diffusion coefficients of the pertinent impurity ions.

Sixth Embodiment

FIG. 13 is a cross section of a Schottky barrier diode (SBD) with an alternating conductivity type layer according to a sixth embodiment of the invention.

Referring now to FIG. 13, the Schottky barrier diode with an alternating conductivity type layer according to the sixth embodiment of the invention includes an n⁺-type cathode layer 71, a drift layer 72 formed of n-type drift regions 72a and p-type partition regions 72b, a Schottky electrode 78 on drift layer 72, and a cathode 77 in ohmic contact with n⁺-type cathode layer 71. Schottky barriers are formed between Schottky electrode 78 and n-type drift regions 72a.

In the Schottky barrier diode with an alternating conductivity type layer according to the sixth embodiment, n-type drift regions 72a and p-type partition regions 72b have almost the same dimensions and almost the same impurity concentrations. When a reverse bias voltage is applied to the Schottky barrier diode, drift layer 72 is depleted to bear the breakdown voltage. The pn-laminate for drift layer 72 is formed, for example, through the steps described in connection with the first embodiment. Then, Schottky electrode 78 and cathode 77 are formed on drift layer 72 and n⁺-type cathode layer 71, respectively. Alternatively, the Schottky barrier diode with an alternating conductivity type layer according to the sixth embodiment is manufactured through any of the processes for manufacturing the diodes according to the second through fifth embodiments.

When a reverse bias voltage is applied, depletion layers expand into the pn-laminate of drift layer 72 and bear the breakdown voltage. When a forward bias voltage is applied, a drift current flows through n-type drift regions 72a.

The widths and the depths of n-type drift regions 72a and p-type partition regions 72b are similar to those of the diode according to the first embodiment.

FIG. 14 is a pair of curves comparing the relationships between the forward voltage and the forward current in an exemplary Schottky barrier diode fabricated in the same way as the diode of the first embodiment and in a conventional Schottky barrier diode. In the figure, the horizontal axis represents the forward voltage ($V_F$) and the vertical axis represents the forward current ($I_F$). Schottky electrode 78 of the exemplary Schottky barrier diode is made of molybdenum. The comparative conventional Schottky barrier diode includes a uniform drift layer.

As FIG. 14 clearly indicates, the forward voltage ($V_F$) for the same breakdown voltage class is reduced by the present Schottky barrier diode much more than that of the conventional Schottky barrier diode.

Since n-type drift regions 72a and p-type partition regions 72b are depleted easily, the impurity concentrations therein are increased and the thickness of drift layer 72 is reduced. Due to the increased impurity concentrations and the reduced thickness of drift layer 72, the forward voltage is reduced greatly, and the tradeoff relation between the forward voltage and the breakdown voltage is improved greatly.

Thus, the Schottky barrier diode with an alternating conductivity type layer according to the sixth embodiment that exhibits a high breakdown voltage and a low forward voltage is manufacture easily by the well established techniques such as ion implantation and thermal diffusion.

Seventh Embodiment

FIG. 15 is a cross section of a MOSFET with an alternating conductivity type layer according to a sixth embodiment of the invention.

Referring now to FIG. 15, the MOSFET includes a pn-laminate for a drift layer 82 on an n⁺-type drain layer 81 with low electrical resistance. Drift layer 82 includes n-type drift regions 82a and p-type partition regions 82b. In the surface portion of drift layer 82, n-channel regions 82d are formed in contact with n-type drift regions 82a, and p-type well regions 83a are formed in contact with p-type partition regions 82b. In p-type well regions 83a, n⁺-type source regions 84 are formed. A gate electrode 86 is disposed above the extended portion of p-type well region 83a, extended between n⁺-type source region 84 and n-channel region 82d, with a gate insulation film 85 interposed therebetween. A source electrode 87 is disposed in common contact with n⁺-type source regions 84 and p-type well regions 83a. A drain electrode 88 is disposed on the back surface of n⁺-type drain layer 81. An insulation film 89 is formed to protect and stabilize the surface of the MOSFET. Insulation film 89 is formed of a thermal oxide film and phosphorous silica glass (PSG). As shown in the figure, source electrode 87 is extended, sometimes, above gate electrode 86 with insulation film 89 interposed therebetween. A drift current flows through n-type drift regions 82a.

The arrangement of n-type drift regions 82a and p-type partition regions 82b is not limited to the planar stripe arrangement. The n-type drift regions 82a or p-type partition regions 82b may be arranged in a lattice pattern, a net pattern, a honey comb pattern and such patterns.

The p-type well regions 83a and p-type partition regions 82b are not always shaped with similar planar shapes. As far as p-type well regions 83a and p-type partition regions 82b are connected with each other, they may be shaped with different shapes. For example, p-type well regions 83a and p-type partition regions 82b are shaped with respective stripes extending perpendicularly to each other.

In the MOSFET with an alternating conductivity type layer according to the seventh embodiment, n-type drift regions 82a and p-type partition regions 82b have almost the same dimensions and almost the same impurity concentrations. When a reverse bias voltage is applied to the MOSFET, drift layer 82 is depleted to bear the breakdown voltage.

The $n^+$-type drain layer 81, n-type drift regions 82a and p-type partition regions 82b are formed by any of the processes for manufacturing the diodes according to the first through fifth embodiments.

Then, n-type channel regions 82d are formed epitaxially. In the similar way as the conventional vertical MOSFET, p-type well regions 83a and $n^+$-type source regions 84 are formed in the surface portion of drift layer 82 by selective ion implantation and subsequent thermal treatment.

Then, gate insulation films 85 are formed by thermal oxidation. Gate electrodes 86 are formed by depositing a polycrystalline silicon film by a vacuum CVD method and by pattering the polycrystalline silicon film by photolithography. Insulation film 89 is deposited and windows are opened by photolithography. Source electrode 87 is formed by depositing an aluminum alloy film and by pattering the aluminum alloy film by photolithography. Drain electrode 88 is formed on the back surface of $n^+$-type drain layer 81. A not shown gate terminal is formed. Thus, the MOSFET with an alternating conductivity type layer shown in FIG. 15 is completed.

The MOSFET with an alternating conductivity type layer shown in FIG. 15 operates in the following way. When a predetermined positive voltage is applied to gate electrodes 86, inversion layers are created in the surface portions of p-type well regions 83a beneath gate electrodes 86. Electrons are injected from $n^+$-type source regions 84 to n-channel regions 82d via the inversion layers. The injected electrons reach $n^+$-type drain layer 81 via n-type drift regions 82a, electrically connecting drain electrode 88 and source electrode 87 with each other.

When the positive voltage is removed from gate electrodes 86, the inversion layers in the surface portions of p-type well regions 83a vanish, electrically disconnecting drain electrode 88 and source electrode 87 from each other. When a reverse bias voltage is increased, depletion layers expand into n-channel regions 82d, n-type drift regions 82a and p-type partition regions 82b from pn-junctions Ja between p-type well regions 83a and n-channel regions 82d, pn-junctions Jb between p-type partition regions 82b and n-type drift regions 82a and not shown pn-junctions between p-type partition regions 82b and n-channel regions 82d, since p-type partition regions 82b are connected to each other by source electrode 87 via p-type well regions 83a. Thus, n-channel regions 82d, n-type drift regions 82a and p-type partition regions 82b are depleted.

When n-type drift regions 82a and p-type partition regions 82b in an exemplary MOSFET of the 300 V class have the similar dimensions as those of the diode described with reference to FIG. 1(a), the dimensions and the impurity concentrations in the other regions and layers are as follows. The specific resistance of $n^+$-type drain layer 81 is 0.01 Ω·cm. The thickness of $n^+$-type drain layer 81 is 350 μm. The diffusion depth of p-type well regions 83a is 1 μm. The surface impurity concentration of p-type well regions 83a is $3 \times 10^{18}$ cm$^{-3}$. The diffusion depth of $n^+$-type source regions 84 is 0.3 μm. And, the surface impurity concentration of $n^+$-type source regions 84 is $1 \times 10^{20}$ cm$^{-3}$.

To provide a vertical MOSFET including a conventional single-layered highly resistive drift layer with a breakdown voltage of the 300 V class, it is necessary for the drift layer thereof to have an impurity concentration of $2 \times 10^{14}$ cm$^{-3}$ and a thickness of around 40 μm. The ON-resistance of the MOSFET with an alternating conductivity type layer according to the seventh embodiment is reduced to one fifth of that of the conventional MOFSET by increasing the impurity concentration in n-type drift regions 82a and by reducing the thickness of drift layer 82 corresponding to the impurity concentration increment in n-type drift regions 82a.

Epitaxial growth of a layer of several μm in thickness and formation of a buried region by thermal diffusion of implanted impurity ions are quite well established techniques. The MOSFET with an alternating conductivity type layer according to the seventh embodiment, that reduces the tradeoff relation between the ON-resistance and the breakdown voltage, is manufactured easily by such quite well established techniques.

By further narrowing n-type drift regions 82a and by increasing the impurity concentration therein, the ON-resistance is further reduced and the tradeoff relation between the ON-resistance and the breakdown voltage is further improved.

FIG. 16 is a cross section of a modification of the MOSFET of FIG. 15. In this modification, a highly resistive $n^-$-type layer 82c is remaining below n-type drift regions 82a and p-type partition regions 82b. In an exemplary MOSFET of the 300 V class, the specific resistance of highly resistive $n^-$-type layer 82c is 10 Ω·cm. The dimensions and impurity concentrations of the other layer and regions are the same with those of the exemplary MOSFET described with reference to FIG. 15.

When p-type partition regions 82b are deep enough, the remaining $n^-$-type layer 82c poses no problems. However, $n^-$-type layer 82c remaining between n-type drift regions 82a and $n^+$-type drain layer 81 increases the ON-resistance. Moreover, since the JFET effect, wherein the depletion layers expanding from p-type partition regions 82b narrow the current paths, is caused, it is preferable for $n^-$-type layer 82c not to be too thick. It is preferable for $n^-$-type layer 82c to be thinner than p-type partition regions 82b.

FIG. 17 is a cross section of another modification of the MOSFET of FIG. 15. A heavily doped $p^+$-type contact region 83b is formed in the surface portion of each p-type well region 83a. The $p^+$-type contact region 83b arranged between $n^+$-type source regions 84 reduces the contact resistance between p-type well region 83a and source electrode 87. By setting the diffusion depth of $p^+$-type contact region 83b to be shallower than that of $n^+$-type source region 84, depletion of the pn-laminate is not prevented.

The semiconductor structures with an alternating conductivity type layer according to the invention are applicable not only to diodes, Schottky barrier diodes and MOSFET's, as exemplary described above, but also to almost all the other semiconductor devices such as bipolar transistors, IGBT's, JFET's, thyristors, MESFET's, and HEMT's. The conductivity types may be exchanged appropriately.

As explained above, the semiconductor device with an alternating conductivity type layer according to the invention includes a first major surface; a second major surface; a first electrode on the first major surface; a second electrode on the second major surface; a pn-laminate formed of drift regions of a first conductivity type and partition regions of a second conductivity type opposite to the first conductivity type; the drift regions and the partition regions extending vertically in parallel to each other between the first major surface and the second major surface and being arranged alternately with each other; and the pn-laminate providing a current path in the ON-state of the semiconductor device and being depleted in the OFF-state of the semiconductor device. At least, the drift regions or the partition regions are formed by single-step ion implantation under an acceleration voltage changed continuously or by multiple-step ion implantation under acceleration voltages changed stepwise.

The regions, not formed by ion implantation, are formed by epitaxial growth or by impurity diffusion. Both the drift regions and the partition regions may be formed by ion implantation.

A characteristic semiconductor structure with a pn-laminate, formed of p-type regions and n-type regions alternately arranged with each other, is realized by the quite well established techniques such as ion implantation and thermal treatment without the need to form trenches with a large aspect ratio and filling each trench with a high quality epitaxial layer.

Since the impurity concentrations in the pn-laminate are increased and the thickness of the pn-laminate is reduced corresponding to the increments of the impurity concentrations, the forward voltage and ON-resistance or ON-voltage are reduced greatly, and the tradeoff relation between the ON-voltage or ON-resistance and the breakdown voltage is improved.

The semiconductor structure with an alternating conductivity type layer according to the invention facilitates realizing a novel power semiconductor device that drastically reduces the power loss.

What is claimed is:

1. A method of manufacturing a semiconductor device including a first layer with low electrical resistance having a first principal surface and a second principal surface, an electrode on the second principal surface of the first layer with low electrical resistance, a second layer having a first surface and a second surface, the second surface of the second layer contacting the first principal surface of the first layer, at least one electrode on the first surface of the second layer, a pn-laminate region within the second layer; and the pn-laminate region including drift regions of a first conductivity type and partition regions of a second conductivity type opposite to the first conductivity type extending vertically between the first surface of the second layer and the second surface of the second layer in parallel to each other and arranged alternately with respect to each other horizontally, the pn-laminate region providing a current path when the semiconductor device is ON and being depleted when the semiconductor device is OFF, the method comprising the steps of:

implanting impurity ions of one of said first and second conductivity types into the first surface of the second layer within the entire pn-laminate region;

selectively implanting impurity ions of the other of said first and second conductivity types into the first surface of the second layer within the pn-laminate region that has been already implanted; and treating the implanted impurity ions thermally to form one of the drift regions and the partition regions.

2. The method according to claim 1, wherein the acceleration voltage for implanting the impurity ions is changed stepwise.

3. The method according to claim 1, wherein the acceleration voltage for implanting the impurity ions is changed continuously.

4. The method according to claim 1, wherein the introduced impurity ions are treated thermally to diffuse the introduced impurity ions and form a diffusion layer for either one of the drift regions and the partition regions, and the other of the drift regions and the partition regions are formed by the ion implantation into the selected portions of the diffusion layer.

5. A method of manufacturing a semiconductor device including a first layer with low electrical resistance having a first principal surface and a second principal surface, an electrode on the second principal surface of the first layer with low electrical resistance, a second layer having a first surface and a second surface, the second surface of the second layer contacting the first principal surface of the first layer, at least one electrode on the first surface of the second layer; a pn-laminate region within the second layer; and the pn-laminate region including drift regions of a first conductivity type and partition regions of a second conductivity type opposite to the first conductivity type extending vertically between the first surface and the second surface of the pn-laminate region in parallel to each other and arranged alternately with respect to each other horizontally, the pn-laminate region providing a current path when the semiconductor device is ON and being depleted when the semiconductor device is OFF, the method comprising the steps of:

forming the second layer;

introducing impurity ions of one of said first and second conductivity types into the first surface of the second layer within the entire pn-laminate region;

selectively introducing impurity ions of the other of said first and second conductivity types into the first surface of the second layer within the pn-laminate region that has been already implanted; and diffusing the introduced impurity ions thermally to form the drift regions, the partition regions and pn-junctions between the drift regions and the partition regions.

6. A method of manufacturing a semiconductor device including a first layer with low electrical resistance having a first principal surface and a second principal surface, an electrode on the second principal surface of the first layer with low electrical resistance, a second layer having a first surface and a second surface, the second surface of the second layer contacting the first principal surface of the first layer, at least one electrode on the first surface of the second layer, a pn-laminate region within the second layer; and the pn-laminate region including drift regions of a first conductivity type and partition regions of a second conductivity type opposite to the first conductivity type extending vertically between the first surface of the second layer and the second surface of the second layer in parallel to each other and arranged alternately with respect to each other horizontally, the pn-laminate region providing a current path when the semiconductor device is ON and being depleted when the semiconductor device is OFF, the method comprising the steps of:

implanting impurity ions into the first surface of the second layer within the pn-laminate region; and treating the implanted impurity ions thermally, whereby to form the drift regions or the partition regions;

wherein the depth of the partition regions is greater than the depth of the drift regions and the depth is measured perpendicular to the first surface of the second layer.

7. A method of manufacturing a semiconductor device including a first layer with low electrical resistance having a first principal surface and a second principal surface, an electrode on the second principal surface of the first layer with low electrical resistance, a second layer having a first surface and a second surface, the second surface of the second layer contacting the first principal surface of the first layer, at least one electrode on the first surface of the second layer, a pn-laminate region within the second layer; and the pn-laminate region including drift regions of a first conductivity type and partition regions of a second conductivity type opposite to the first conductivity type extending vertically between the first surface of the second layer and the second surface of the second layer in parallel to each other and arranged alternately with respect to each other horizontally, the pn-laminate region providing a current path when the semiconductor device is ON and being depleted when the semiconductor device is OFF, the method comprising the steps of:

implanting impurity ions into the first surface of the second layer within the pn-laminate region; and treating the implanted impurity ions thermally, whereby to form the drift regions or the partition regions;

wherein the doping profile of the partition regions has a plurality of peaks of concentration, and the doping profile is measured perpendicular to the first surface of the second layer.

8. A method of manufacturing a semiconductor device comprising:

forming a first layer with low electrical resistance having a first principal surface and a second principal surface;

forming an electrode on the second principal surface of the first layer with low electrical resistance;

forming a second layer having a first surface and a second surface, the second surface of the second layer contacting the first principal surface of the first layer;

forming at least one electrode on the first surface of the second layer;

implanting impurity ions of one of said first and second conductivity types into the first surface of the second layer within a pn-laminate region;

selectively implanting impurity ions of the other of said first and second conductivity types into the first surface of the second layer within the pn-laminate region; and treating the implanted impurity ions thermally, whereby to form a plurality of drift regions of a first conductivity type and a plurality of partition regions of a second conductivity type opposite to the first conductivity type extending vertically between the first surface of the second layer and the second surface of the second layer in parallel to each other and arranged alternately with respect to each other horizontally;

wherein the pn-laminate region providing a current path when the semiconductor device is ON and being depleted when the semiconductor device is OFF.

9. A method of manufacturing a semiconductor device comprising:

forming a first layer with low electrical resistance having a first principal surface and a second principal surface;

forming an electrode on the second principal surface of the first layer with low electrical resistance;

forming a second layer having a first surface and a second surface, the second surface of the second layer contacting the first principal surface of the first layer;

forming at least one electrode on the first surface of the second layer; and forming a pn-laminate region within the second layer, the pn-laminate region having drift regions of a first conductivity type and partition regions of a second conductivity type opposite to the first conductivity type extending vertically between the first surface of the second layer and the second surface of the second layer in parallel to each other and arranged alternately with respect to each other horizontally, the pn-laminate region providing a current path when the semiconductor device is ON and being depleted when the semiconductor device is OFF, wherein the pn-laminate region is formed by:

implanting impurity ions of one of said first and second conductivity types into the first surface of the second layer within the entire pn-laminate region;

selectively implanting impurity ions of the other of said first and second conductivity types into the first surface of the second layer within the pn-laminate region to be formed that has already been implanted; and treating the implanted impurity ions thermally to form the drift regions of the first conductivity type and the partition regions of the second conductivity type.

* * * * *

UNITED STATES PATENT AND TRADEMARK OFFICE
CERTIFICATE OF CORRECTION

PATENT NO. : 6,673,679 B1
DATED : January 6, 2004
INVENTOR(S) : Yasushi Miyasaka et al.

It is certified that error appears in the above-identified patent and that said Letters Patent is hereby corrected as shown below:

<u>Title page,</u>
Item [57], ABSTRACT, please change "9 Claims" to -- 8 Claims --

<u>Column 19,</u>
Line 40, please delete Claim 8

Signed and Sealed this

Thirteenth Day of April, 2004

JON W. DUDAS
*Acting Director of the United States Patent and Trademark Office*